(12) United States Patent
Kim et al.

(10) Patent No.: US 7,811,868 B2
(45) Date of Patent: Oct. 12, 2010

(54) METHOD FOR MANUFACTURING A SIGNAL LINE, THIN FILM TRANSISTOR PANEL, AND METHOD FOR MANUFACTURING THE THIN FILM TRANSISTOR PANEL

(75) Inventors: Do-Hyun Kim, Seoul (KR); Won-Suk Shin, Yongin-si (KR); Chang-Oh Jeong, Suwon-si (KR); Hong-Sick Park, Suwon-si (KR); Eun-Guk Lee, Yongin-si (KR); Je-Hun Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 224 days.

(21) Appl. No.: 11/932,233

(22) Filed: Oct. 31, 2007

(65) Prior Publication Data
US 2008/0203390 A1 Aug. 28, 2008

(30) Foreign Application Priority Data
Feb. 22, 2007 (KR) ............... 10-2007-0017654

(51) Int. Cl.
*H01L 21/768* (2006.01)
(52) U.S. Cl. ............... 438/151; 257/E21.582
(58) Field of Classification Search ............ 257/59
See application file for complete search history.

(56) References Cited

U.S. PATENT DOCUMENTS

| | | |
|---|---|---|
| 6,407,780 B1 | 6/2002 | Sung |
| 6,424,389 B1 | 7/2002 | Ono et al. |
| 6,433,842 B1 | 8/2002 | Kaneko et al. |
| 7,416,681 B2 * | 8/2008 | Kim et al. ............ 252/79.1 |
| 7,521,366 B2 * | 4/2009 | Kwon et al. ............ 438/704 |
| 2003/0178656 A1 * | 9/2003 | Kwon et al. ............ 257/288 |
| 2004/0036835 A1 | 2/2004 | Lee et al. |
| 2004/0195574 A1 * | 10/2004 | Ahn et al. ............ 257/72 |

(Continued)

FOREIGN PATENT DOCUMENTS

JP 06-069236 3/1994

(Continued)

*Primary Examiner*—Benjamin P Sandvik
(74) *Attorney, Agent, or Firm*—F. Chau & Associates, LLC

(57) ABSTRACT

A method for manufacturing a thin film transistor array panel includes forming a gate line on a substrate; sequentially forming a gate insulating layer, a silicon layer, and a conductor layer including a lower layer and an upper layer on the gate line, forming a photoresist film, on the conductor layer, patterning the photoresist film to form a photoresist pattern including a first portion and a second portion having a greater thickness than the first portion, etching the upper layer and the lower layer by using the photoresist pattern as art etch mask, etching the silicon layer by using the photoresist pattern as an etch mask to form a semiconductor, removing the second portion of the photoresist pattern by using an etch back process, selectively wet-etching the upper layer of the conductor layer by using the photoresist pattern as an etch mask, dry-etching the lower layer of the conductor layer by using the photoresist pattern as an etch mask to form a data line and a drain electrode including remaining upper and lower layers, and forming a pixel electrode connected to the drain electrode.

16 Claims, 43 Drawing Sheets

U.S. PATENT DOCUMENTS

| | | | |
|---|---|---|---|
| 2006/0050192 | A1 | 3/2006 | Cho et al. |
| 2009/0233388 | A1* | 9/2009 | Kwon et al. .................. 438/22 |

FOREIGN PATENT DOCUMENTS

| | | |
|---|---|---|
| JP | 2001-044166 | 2/2001 |
| JP | 2001-166336 | 6/2001 |
| JP | 2001-332740 | 11/2001 |
| JP | 2002-111004 | 4/2002 |
| JP | 2003-005220 | 1/2003 |
| KR | 1020040046384 | 6/2004 |
| KR | 1020050067934 | 7/2005 |
| KR | 1020050117846 | 12/2005 |
| KR | 1020060021531 | 3/2006 |
| KR | 1020060073380 | 6/2006 |
| KR | 100603839 | 7/2006 |

* cited by examiner

US 7,811,868 B2

METHOD FOR MANUFACTURING A SIGNAL LINE, THIN FILM TRANSISTOR PANEL, AND METHOD FOR MANUFACTURING THE THIN FILM TRANSISTOR PANEL

CROSS-REFERENCE TO RELATED APPLICATION

This application claims priority to Korean Patent Application No. 10-2007-0017654 filed on Feb. 22, 2007, the entire contents of which are incorporated herein by reference.

BACKGROUND OF THE INVENTION a) Technical Field

The present invention relates to a method for manufacturing a signal line, a thin film transistor panel, and a method for manufacturing the thin film transistor panel.

(b) Discussion of the Related Art

An active matrix display device, such as a liquid crystal display (LCD), an organic light emitting diode (OLED) display, and an electrophoretic display, may include a plurality of pixels arranged in a matrix and having an electric-field generating electrode and a switching element.

The switching elements for the display device may include a thin film transistor (TFT) having three terminals such a gate, a source, and a drain. Gate lines transmitting control signals for controlling the TFTs and data lines transmitting data signals to be supplied to the electric-field generating electrodes through the TFTs are also provided in the flat panel display. The thin film transistor of each pixel transmits or blocks a data signal transmitted to an electric-field, generating electrode from the source according to scanning signals transmitted to the gate. Also, the display includes a plurality of signal lines including a plurality of gate lines for transmitting the scanning signals and a plurality of data lines for transmitting the data signals.

The panel including the electric-field generating electrodes, the thin film transistors, and the signal lines is referred to as a thin film transistor panel.

The thin film transistor panel for the display device may have a layered structure including several conductive layers and insulating layers. The electric-field generating electrodes, the pate lines, and the data lines are formed in different layers and are insulated from each other by insulating layers.

To complete the thin film transistor panel having the layered structure, several photolithography processes including several photo steps and several etch steps are required for manufacturing an LCD panel. Since the production cost increases as the number of photolithography processes increases, reducing the number of photolithography processes reduces cost.

In addition to reducing the number of photolithography processes, there is a need to minimize the number of faulty display devices and maximize the aperture ratio of the pixels when simplifying the manufacturing process.

SUMMARY OF THE INVENTION

Embodiments of the present invention provide a method for manufacturing a signal line, a thin film transistor array, and a method for manufacturing the thin film transistor array to minimize the number of faulty display devices and to maximize the aperture ratio of pixels as well as to simplify the manufacturing process.

A method for manufacturing a signal line, according to an embodiment of the present invention, includes forming a lower layer including at least one metal layer; depositing an upper layer including at least Cu metal on the lower layer; forming a photoresist film on the upper layer; selectively wet-etching the upper layer by using the photoresist film as an etch mask; and dry-etching the lower layer by using the photoresist film as an etch mask.

An etchant of the wet-etching may include ethylene glycol, sulfuric acid (H2SO4), nitric acid, and deionized water.

The etchant may include ethylene glycol at about 0.1 wt %-about 30 wt %, sulfuric acid (H2SO4) at about 0.1. wt %-about 30 wt %, nitric acid at about 1.0 wt %-about 70 wt %, and deionized water for the remainder.

The lower layer may be made of a conductive layer including at least one of Cr, Al and Mo.

A method for forming a thin film transistor array panel, according to an embodiment of the present invention, includes forming a gate line on a substrate; sequentially forming a gate insulating layer, a silicon layer, and a conductor layer including a lower layer and an upper layer on the gate line; forming a photoresist film on the conductor layer; patterning the photoresist film to form a photoresist pattern including a first portion and a second portion having the greater thickness than the first portion; etching the upper layer and the lower layer by using the photoresist pattern as an etch mask; etching the silicon layer by using the photoresist pattern as an etch mask to form a semiconductor; removing the second portion of the photoresist pattern by using an etch-back process; selectively wet-etching the upper layer of the conductor layer by using the photoresist pattern as an etch mask; dry-etching the lower layer of the conductor layer by using the photoresist pattern as an etch mask to form, a data line and a drain electrode including remaining upper and lower layers; and forming a pixel electrode connected to the drain electrode.

The first portion of the photoresist pattern may be aligned with the region corresponding to the data line and the drain electrode, and the second portion of the photoresist pattern may be aligned with a channel region between a source electrode of the data line and the drain electrode.

The etchant for selectively wet-etching the upper layer may include ethylene glycol, sulfuric acid (H2SO4), nitric acid, and deionized water.

The upper layer may include Cu and the lower layer includes one of Mo, Cr, and Al.

The upper layer and the lower layer may be etched under different etching conditions, i.e., the upper layer may be wet-etched and the lower layer may be dry-etched.

The upper layer and the lower layer may be etched under the same etching conditions.

The etchant for etching the upper layer and the lower layer together in the etching of the upper layer and the lower layer may include hydrogen peroxide.

The etch-back process may be executed before the completion of the semiconductor.

The etch-back process may be executed before dry-etching the lower layer.

The gate line may include a single layer of a conductive layer including Cu, or a multi-layer including the single layer.

A thin film transistor array panel, according to an embodiment of the present invention, includes a gate line including a gate electrode; a gate insulating layer formed on the gate line; a semiconductor layer formed on the gate insulating layer; a data line including a source electrode and a drain electrode facing the source electrode, wherein the data line and the drain electrode are formed on the semiconductor layer; a passivation layer covering the exposed semiconductor layer; and a pixel electrode connected to the drain electrode, wherein the semiconductor layer except for the channel region between the drain electrode and the source electrode has the same plane shape as the data line and the drain electrode.

The data line and the drain electrode may include a first conductive layer including Cu or a Cu alloy.

The data line and the drain electrode may include a second conductive layer formed under the first conductive layer.

The second conductive layer may include one of Cr, a Cr alloy, Mo, a Mo alloy, Al, and an Al alloy.

The first conductive layer is only located on the semiconductor layer, and the second conductive layer except for the channel region has the same plane shape as the semiconductor layer.

The first and second conductive layers may have different taper angles.

The taper angle of the side wall of the first conductive layer may be in the range of about 40 degrees to about 60 degrees.

The taper angle of the side wall of the second conductive layer may be in the range of about 80 degrees to about 90 degrees.

The taper angle of the side wall of the semiconductor layer may be in the range of about 50 degrees to about 70 degrees.

A thin film transistor array panel, according to an embodiment of the present invention, includes a gate line including a gate electrode; a gate insulating layer formed on the gate line; a semiconductor layer formed on the gate insulating layer; a data line including a source electrode and a drain electrode facing the source electrode, wherein the data line and the drain electrode are formed on the semiconductor layer; a passivation layer covering an exposed portion of the semiconductor layer; and a pixel electrode connected to the drain electrode, wherein the semiconductor layer except for the channel region between the drain electrode and the source electrode protrudes from the data line and the drain electrode with a width of about 0.5 μm.

The data line and the drain electrode may include a first conductive layer including Cu or a Cu alloy.

The data line and the drain electrode may include a second conductive layer formed under the first conductive layer.

The second conductive layer may include Mo or a Mo alloy.

The second conductive layer may have a portion protruding from the first conductive layer.

BRIEF DESCRIPTION OF THE DRAWINGS

Exemplary embodiments of the present invention can be understood in more detail with reference to the accompanying drawings, in which.

DETAILED DESCRIPTION OF EMBODIMENTS

Figure 1:
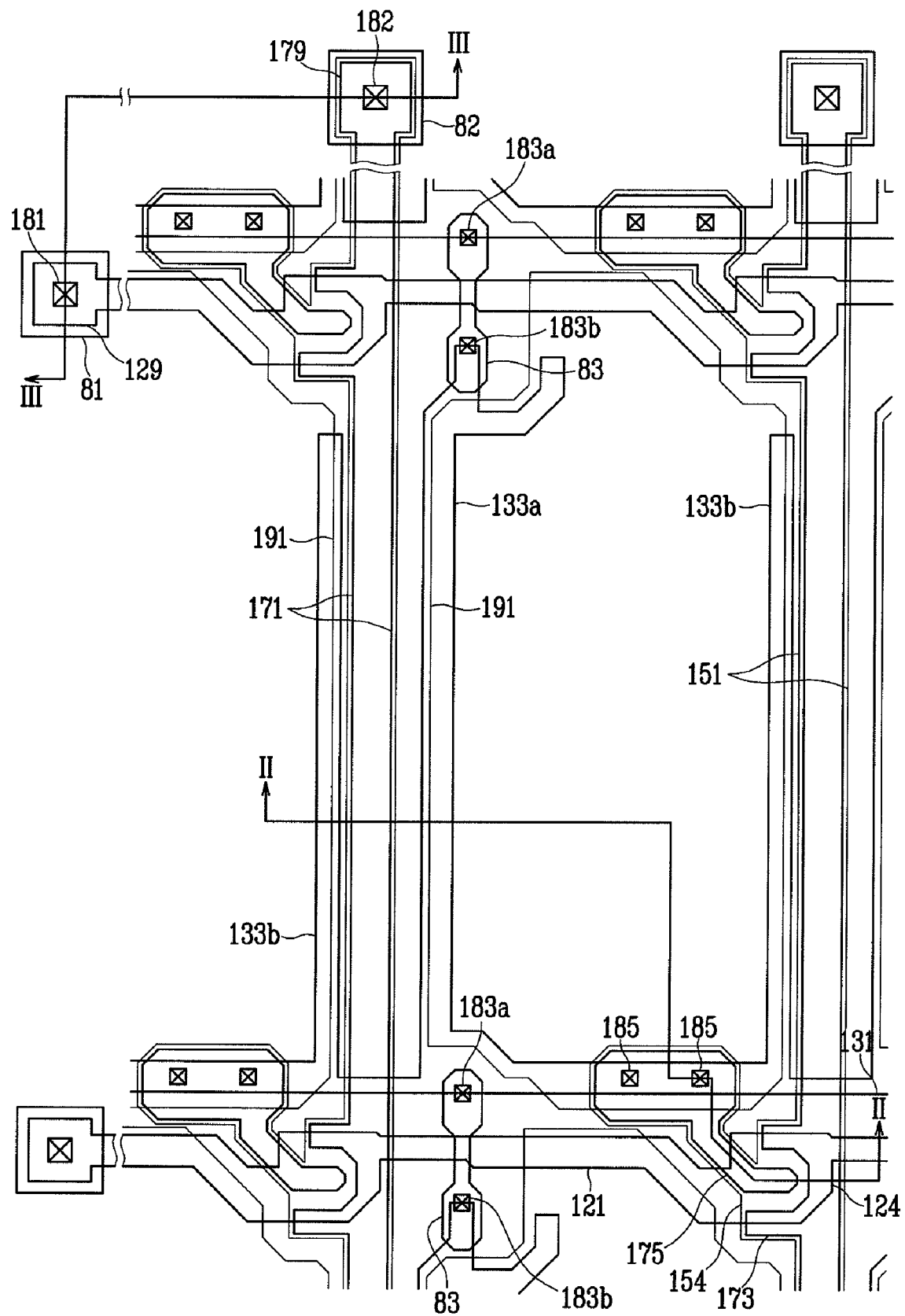
FIG. 1 is a layout view of a TFT array panel for a liquid crystal display according to an embodiment of the present invention.

Exemplary embodiments of the present invention will be described more fully hereinafter with reference to the accompanying drawings. The present invention may, however, be embodied in many different forms and should not be construed as limited to the embodiments set forth herein.

In the drawings, the thickness of layers, films, and regions may be exaggerated for clarity. Like numerals may refer to like elements throughout. It will be understood that when an element such as a layer, film, region, or substrate is referred to as being "on" another element, it can be directly on the other element or intervening elements may also be present.

A TFT array panel according to an embodiment of the present invention will now be described in detail with reference to FIGS. 1 to 3.

Figure 2:
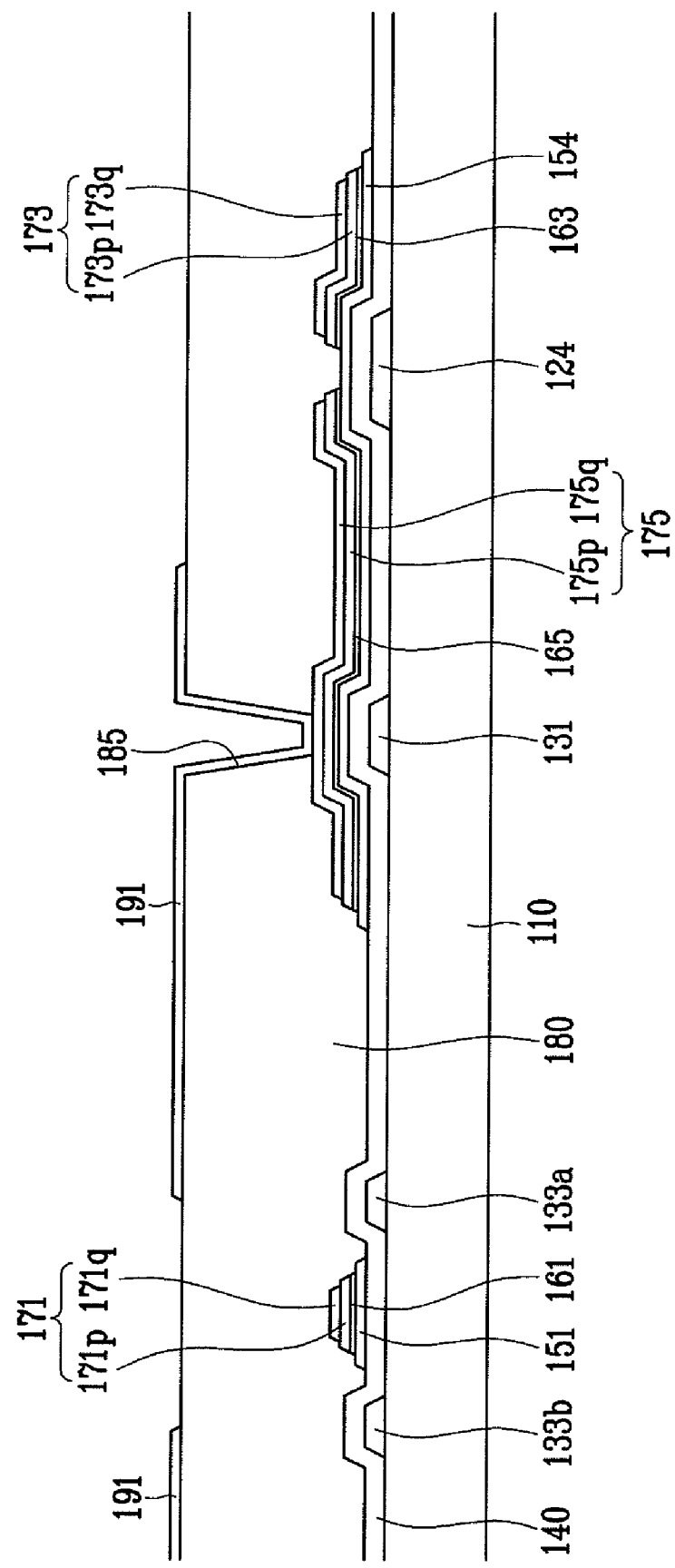
FIGS. 2 and 3 are sectional views of the TFT array panel shown in FIG. 1, taken along the lines II-II and III-III, respectively.
Figure 3:
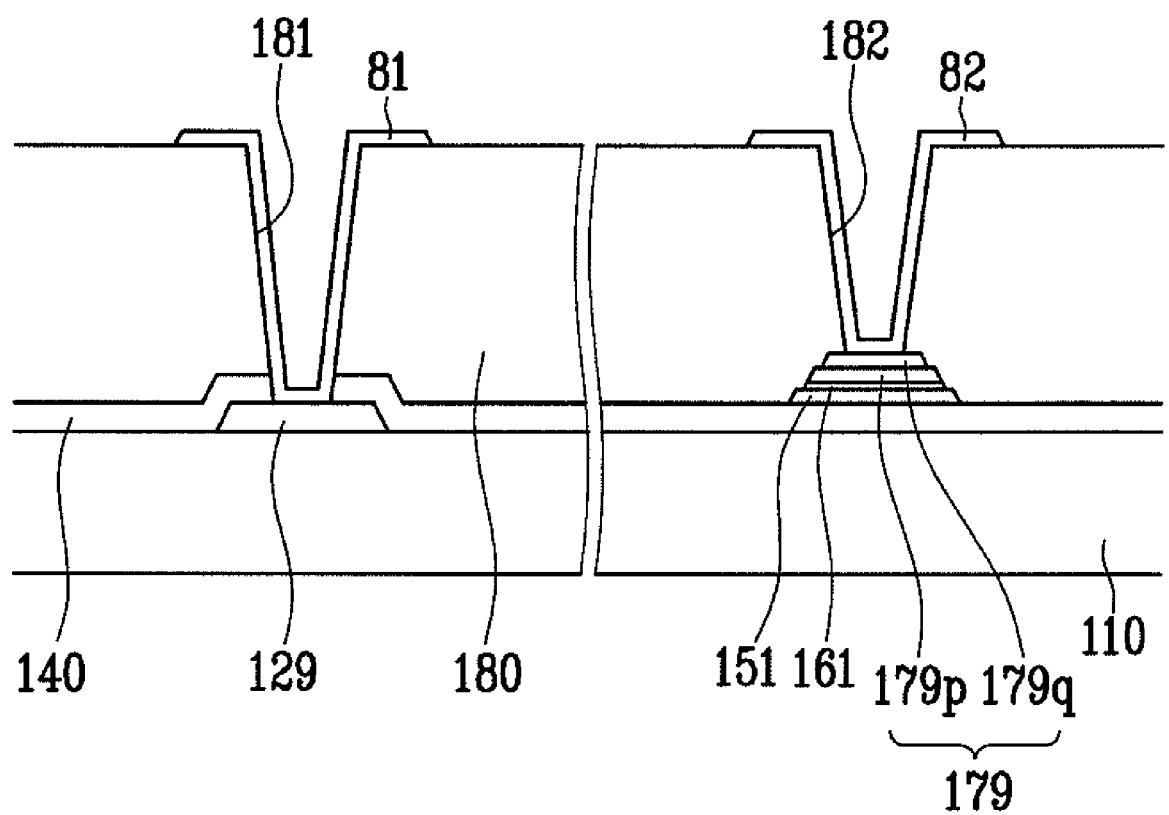

FIG. 1 is a layout view of a TFT array panel for an LCD according to an embodiment of the present invention, and FIGS. 2 and 3 are sectional views of the TFT array panel shown in FIG. 1 taken along the lines II-II and III-III.

A plurality of gate lines 121 and a plurality of storage electrode lines 131 are formed on an insulating substrate 110 made of a material such as transparent glass or plastic.

The gate lines 121 transmit gate signals and extend substantially in a transverse direction. Each of the gate lines 121 includes a plurality of gate electrodes 124 projecting therefrom, for example in a downward direction, and an end portion 129 having a large area for contact with another layer or an external driving circuit. A gate driving circuit (not shown)

for generating the gate signals may be mounted on a flexible printed circuit (FPC) film (not shown), which may be attached to the substrate 110, directly mounted on the substrate 110, or integrated with the substrate 110. The gate lines 121 may extend to be connected to a driving circuit that may be integrated with the substrate 110, The storage electrode lines 131 are supplied with a predetermined voltage, and each of the storage electrode lines 131 includes a stem portion extending substantially parallel to the gate lines 121 and a plurality of pairs of storage electrodes 133a and 133b branched from the stem portions. Each of the storage electrode lines 131 is disposed between two adjacent gate lines 121, and a stem portion is closer to one of the two adjacent gate lines 121. Each of the storage electrodes 133a and 133b has a fixed end portion connected to the stem portion and a free end portion disposed opposite thereto. The fixed end portion of the storage electrode 133a has a large area, and the free end portion thereof is divided into a linear branch and a curved branch. However, the storage electrode lines 131 may have various shapes and arrangements.

The gate lines 121 and the storage electrode lines 131 are can be made of an aluminum (Al) containing metal such as Al and an Al alloy, a silver (Ag) containing metal such as Ag and a Ag alloy, a copper (Cu) containing metal such as Cu and a Cu alloy, a molybdenum (Mo) containing metal such as Mo and a Mo alloy, chromium (Cr), tantalum (Ta), or titanium (Ti). However, the gate and storage lines 121, 131 may have a multi-layered structure including two conductive films (not shown) having different physical characteristics. One of the two films is can be made of a low resistivity metal such as an Al-containing metal, a Ag-containing metal, and a Cu-containing metal for reducing signal delay or voltage drop. The other film can be made of a material such as a Mo-containing metal, Cr, Ta, or Ti, which have good physical, chemical, and electrical contact characteristics with other materials such as indium tin oxide (ITO) or indium zinc oxide (IZO). Examples of a multi-layered structure include four films of a lower Mo (alloy) film, a middle lower Cu film, a middle upper nitride Cu film, and an upper Mo (alloy) film, three films of a lower Mo (alloy) film, a middle Cu film, and an upper Mo (alloy) film, three films of a lower Mo (alloy) film, a middle Cu film, and an upper nitride Cu film, and two films of a lower Mo (alloy) film and an upper Cu (alloy) film. However, the gate lines 121 and the storage electrode lines 131 may be made of various metals or conductors.

The lateral sides of the gate lines 121 and the storage electrode lines 131 are inclined relative to a surface of the substrate 110, and the inclination angle thereof is in a range of about 30 to about 80 degrees.

A gate insulating layer 140 can be made of silicon nitride (SiNx) or silicon oxide (SiOx) is formed on the gate lines 121, and the storage electrode lines 131, A plurality of semiconductor stripes 151, for example, made of hydrogenated amorphous silicon (abbreviated to "a-Si") or polysilicon, are formed on the gate insulating layer 140. The semiconductor stripes 151 extend substantially in the longitudinal direction and include a plurality of projections 154 branched out toward the gate electrodes 124.

A plurality of ohmic contact stripes and islands 161 and 165 are formed on the semiconductor stripes 151. The ohmic contact stripes and islands 161 and 165 are preferably made of n+ hydrogen a ted a-Si heavily doped with an N-type impurity such as phosphorous, or the ohmic contact stripes and islands 161, 165 may be made of silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are, for example, in a range of about 30 to about 80 degrees.

A plurality of data lines 171 and a plurality of drain electrodes 175 are formed on the ohmic contacts 161 and 165.

The data lines 171 transmit data signals and extend substantially in the longitudinal direction to intersect the gate lines 121. Each data line 171 also intersects the storage electrode lines 131 and runs between adjacent pairs of storage electrodes 133a and 133b. Each data line 171 includes a plurality of source electrodes 173 projecting toward the gate electrodes 124 and being curved, for example, like a crescent, and an end portion 179 having a large area for contact with another layer or an external driving circuit. A data driving circuit (not shown) for generating the data signals may be mounted on an FPC film (not shown), which may be attached to the substrate 110, directly mounted on the substrate 110, or integrated with the substrate 110. The data lines 171 may extend to be connected to a driving circuit that may be integrated with the substrate 110.

The drain electrodes 175 are separated from the data lines 171 and disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173 having a "U" shape.

The data lines 171 and the drain electrodes 175 include, for example, two conductive layers, such as a lower layer 171p, 175p, and an upper layer 171q, 175q. The lower layer 171p, 175p is made of, for example, a refractory metal such as Cr, Mo, Ta, Ti, or alloys thereof and the upper layer 171q, 175q is made of, for example, a low resistivity metal of Cu or a Cu alloy for reducing signal delay or voltage drop. Examples of the combination of the two conductive films include a lower Mo (alloy) film and an upper Cu (alloy) film.

As shown in FIGS. 2 and 3, the lower layer and the upper layer of the source electrode 173, the drain electrode 175, and the end portion 179 of the data line 171 are respectively denoted by adding "p" and "q" to the reference numbers of the source electrode 173, the drain electrode 175, and the end portion 179 of the data line 171, respectively.

The data lines 171 and the drain electrodes 175 have inclined edge profiles, and the inclination angles thereof are in a range of about 30 to about 80 degrees.

The ohmic contacts 161 and 165 are interposed between the underlying semiconductor stripes 151 and the overlying conductors 171 and 175 thereon, and reduce the contact resistance therebetween.

Although the semiconductor stripes 151 have almost the same planar shapes as the data lines 171 and the drain electrodes 175, as well as the underlying ohmic contacts 161 and 165, the semiconductor stripes 151 have some portions that are disposed at the circumference of the data lines 171 and the drain electrodes 175, and the ohmic contacts 161 and 165. These portions of the semiconductor stripes 151 are not covered with the data lines 171 and the drain electrodes 175 or the ohmic contacts 161 and 165. These portions unavoidably generated in the manufacturing process may cause waterfall and afterimage phenomena and a reduction of the aperture ratio. Accordingly, there is a need to minimize or remove these portions.

Also, the semiconductor stripes 151 include some exposed portions, which are not covered by the data lines 171 and the drain electrodes 175, such as portions located between the source electrodes 173 and the drain electrodes 175.

A gate electrode 124, a source electrode 173, and a drain electrode 175 along with a projection 154 of a semiconductor stripe 151 form a TFT having a channel formed in the projection 154. The channel is disposed between the source electrode 173 and the drain electrode 175.

A passivation layer 180 is formed on the data lines 171, the drain electrodes 175, and the exposed portions 154 of the semiconductor stripes 151.

The passivation layer 180 is made of, for example, an inorganic or organic insulator, and it may have a flat top surface. Examples of the inorganic insulator include silicon nitride and silicon oxide. The organic insulator may have photosensitivity and a dielectric constant of less than, about 4.0, such as a-Si:C:O and a-Si:O:F formed, by plasma enhanced, chemical vapor deposition (PECVD). The passivation layer 1.80 may include a lower film of an inorganic insulator and an upper film of an organic insulator such that it takes the insulating characteristics of the organic insulator while preventing the exposed portions 154 of the semiconductor stripes 151 from being damaged by the organic insulator.

The passivation layer 180 has a plurality of contact holes 182 and 185 exposing the end portions 179 of the data lines 171, and the drain electrodes 175, respectively. The passivation layer 180 and the gate insulating layer 140 have a plurality of contact holes 181 exposing the end portions 129 of the gate lines 121, a plurality of contact holes 183a exposing portions of the storage electrode lines 131 near the fixed end portions of the storage electrodes 133b, and a plurality of contact holes 183b exposing the linear branches of the free end portions of the storage electrodes 133a.

A plurality of pixel electrodes 191, a plurality of overpasses 83, and a plurality of contact assistants 81 and 82 are formed on the passivation layer 180. The pixel electrodes 191, overpasses 83 and contact assistants 81 and 82 are made of, for example, a transparent conductor such as ITO or IZO, or a reflective conductor such as Ag, Al, Cr, and alloys thereof.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode (not shown) of the opposing panel supplied with a common voltage, which determine the orientations of liquid crystal molecules (not shown) of a liquid crystal layer. A pixel electrode 191 and the common electrode form a capacitor referred to as a "liquid crystal capacitor," which stores applied voltages after the TFT turns off.

A pixel electrode 191 overlaps a storage electrode line 131 including storage electrodes 133a and 133b. The pixel electrode 191 and a drain electrode 175 connected thereto and the storage electrode line 131 form an additional capacitor referred to as a "storage capacitor," which enhances the voltage storing capacity of the liquid crystal capacitor.

The overpasses 83 cross over the gate lines 121, and they are connected to the exposed portions of the storage electrode lines 131 and the exposed linear branches of the free end portions of the storage electrodes 133b through the contact holes 183a and 183b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The contact assistants 81 and 82 are connected to the end portions 129 of the gate lines 121, and the end portions 179 of the data lines 171, through the contact holes 181 and 182, respectively. The contact assistants 81 and 82 protect the end portions 129 and 179, and enhance the adhesion between the end portions 129 and 179 and external devices.

A method of manufacturing the TFT array panel, shown in FIGS. 1 to 3 according to an embodiment of the present invention will be described with reference to FIGS. 4 to 22.

Figure 4:
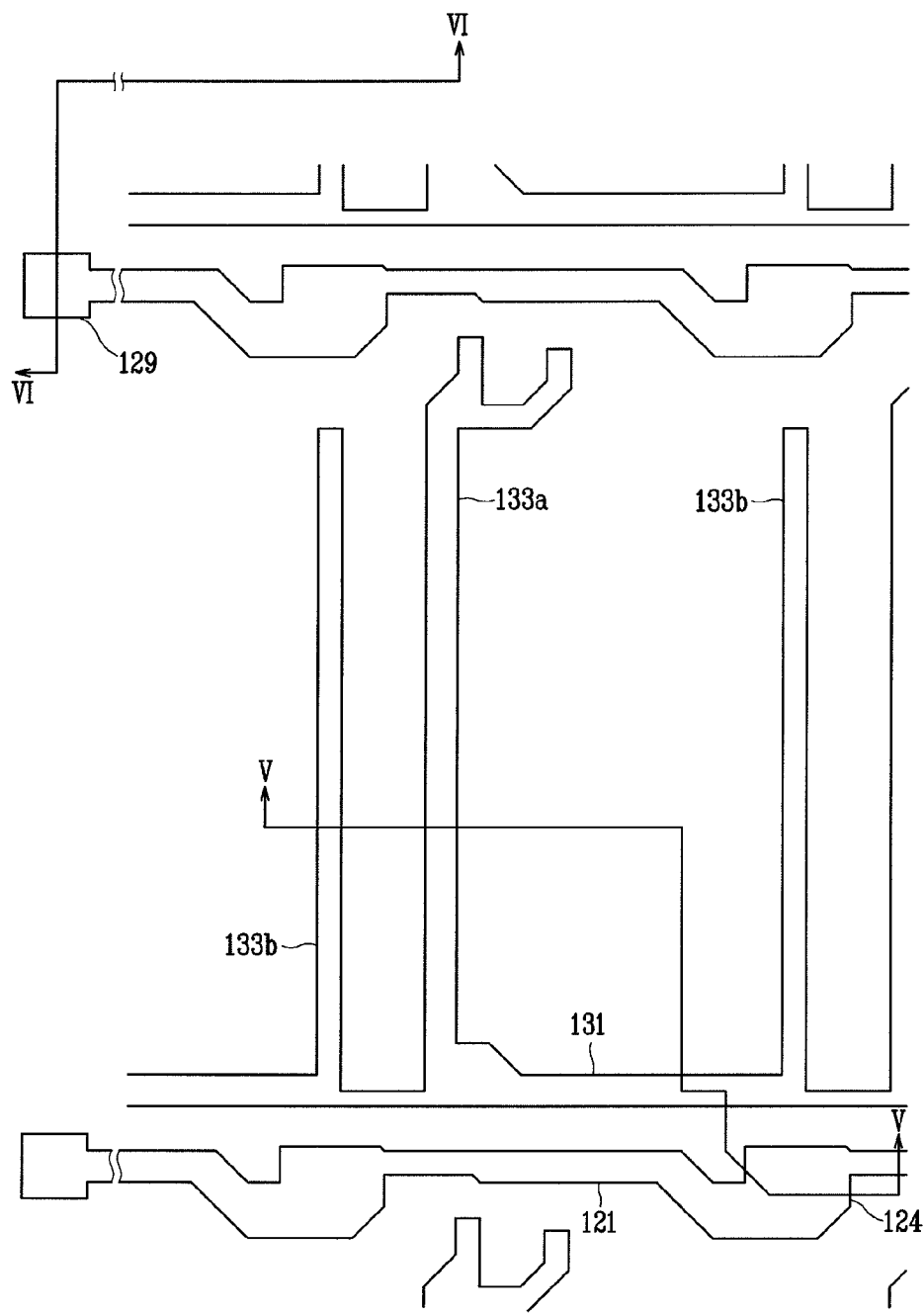
FIG. 4 is a layout view of the TFT array panel shown in FIGS. 1, 2, and 3 during a manufacturing method thereof according to an embodiment of the present invention.
Figure 5:
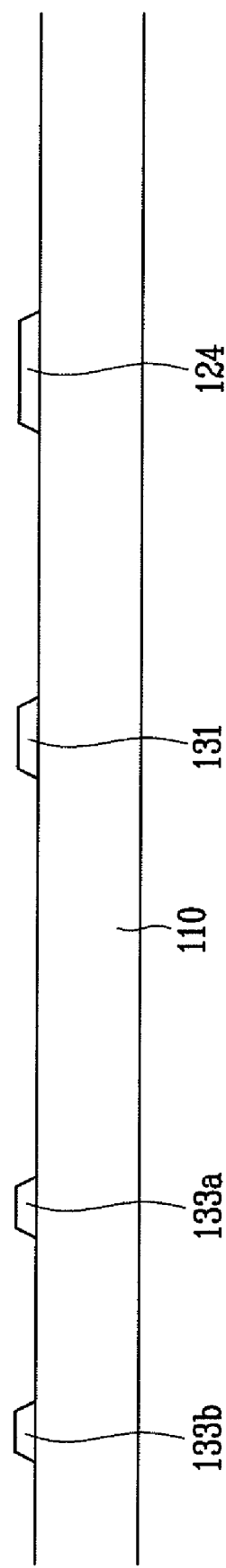
FIGS. 5 and 6 are sectional views of the TFT array panel shown in FIG. 4 taken along the lines V-V and VI-VI, respectively.
Figure 6:
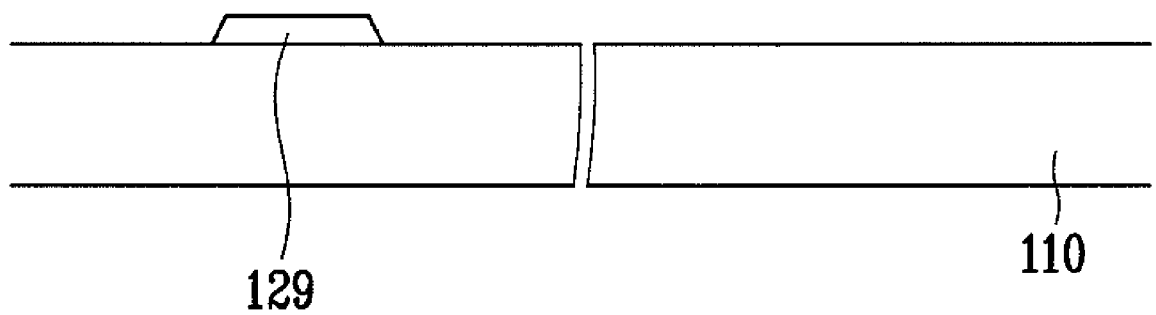
Figure 7:
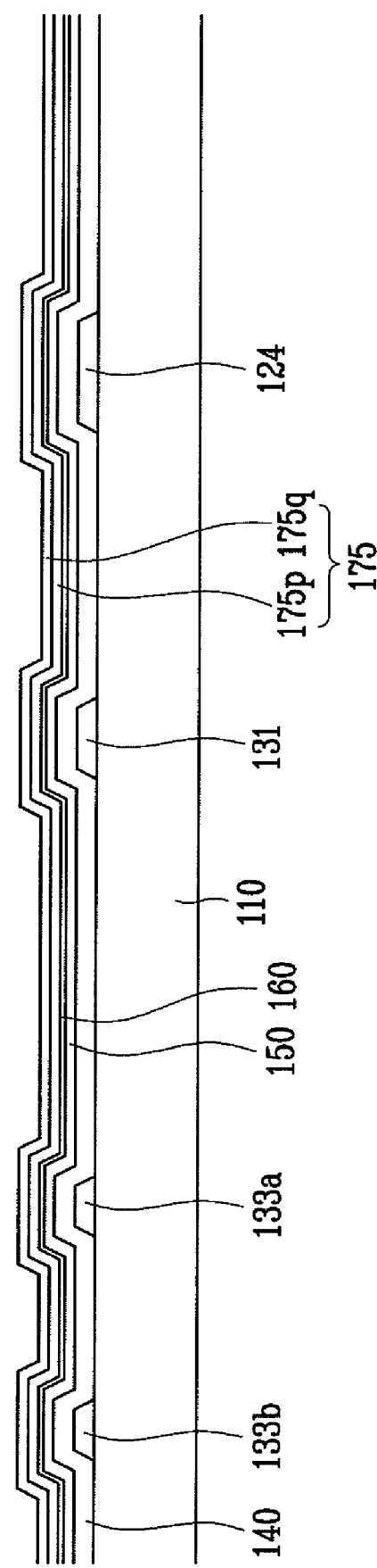
FIGS. 7 to 16 are sectional views of the TFT array panel in the step(s) following the step(s) shown in FIGS. 4 to 6.
Figure 8:
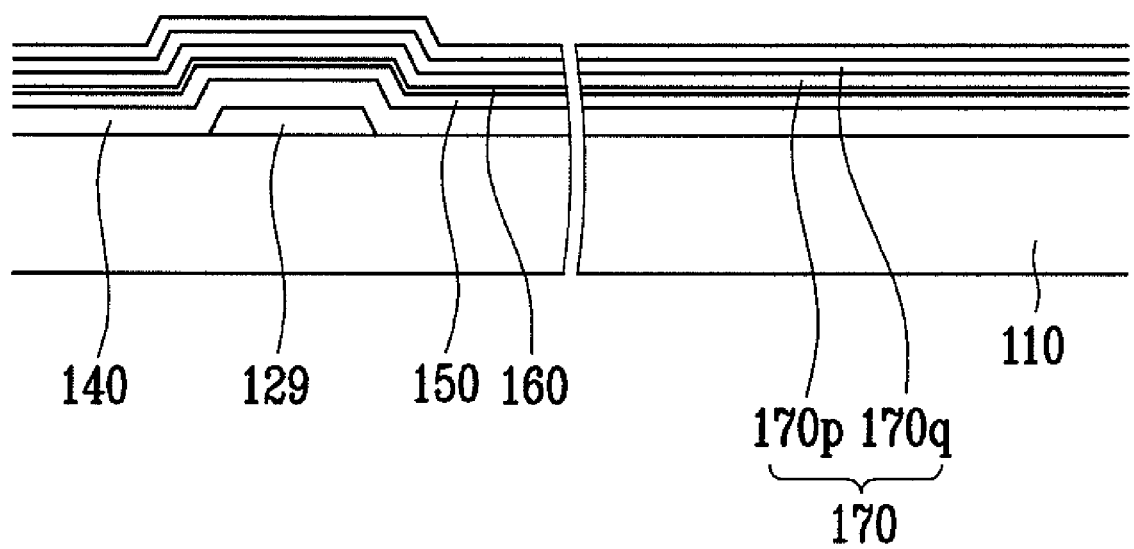
Figure 20:
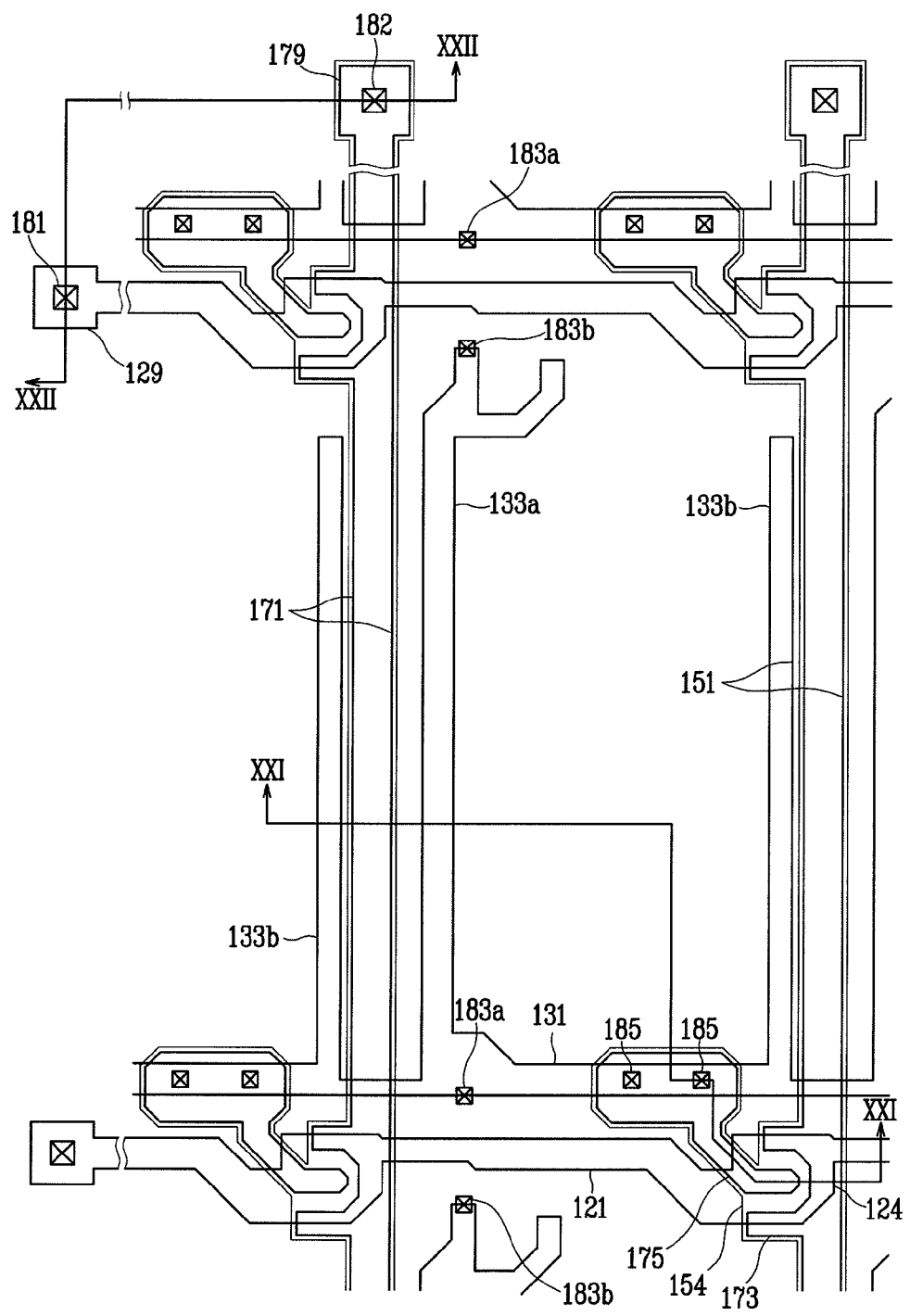
FIG. 20 is a layout view of the TFT array panel at a step(s) following the step(s) shown in FIGS. 17 to 19.
Figure 21:
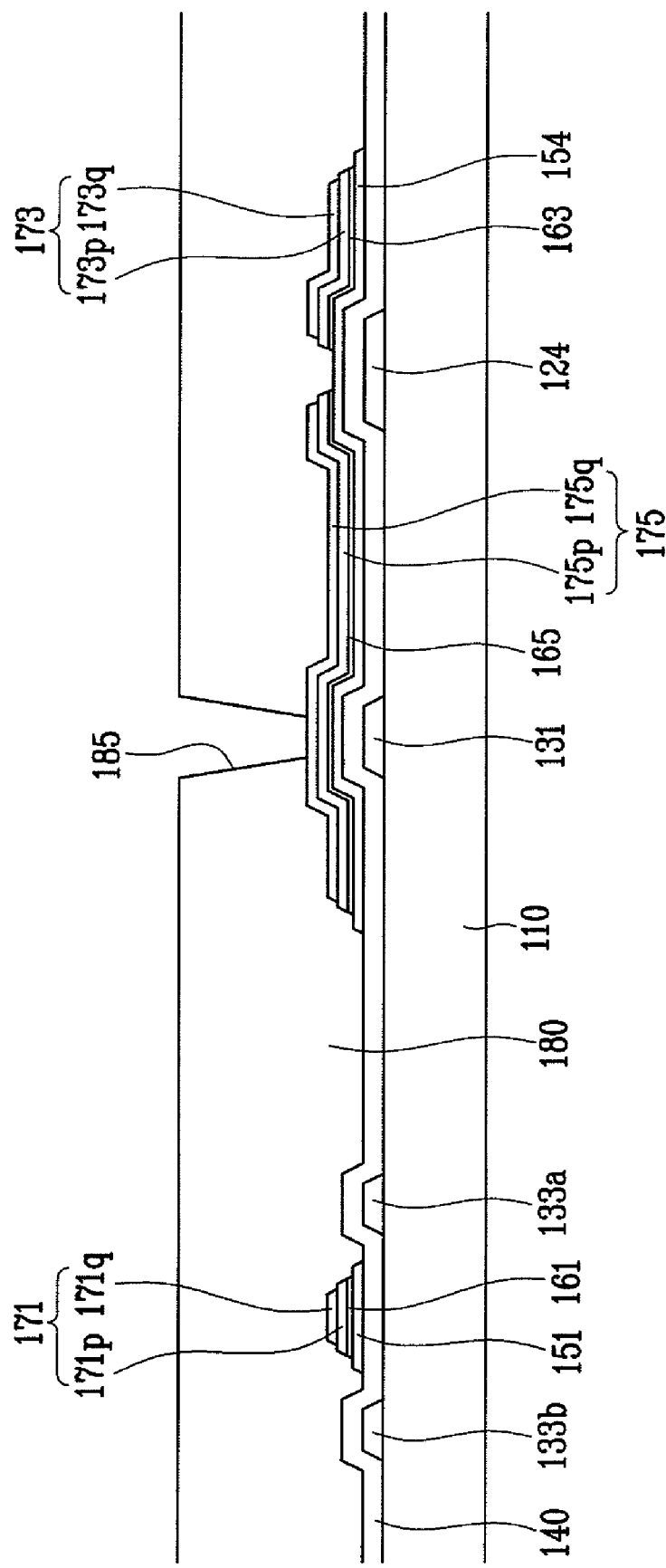
FIGS. 21 and 22 are sectional views of the TFT array panel shown in FIG. 20 taken along the lines XXI-XXI and XXII-XXII, respectively.
Figure 22:
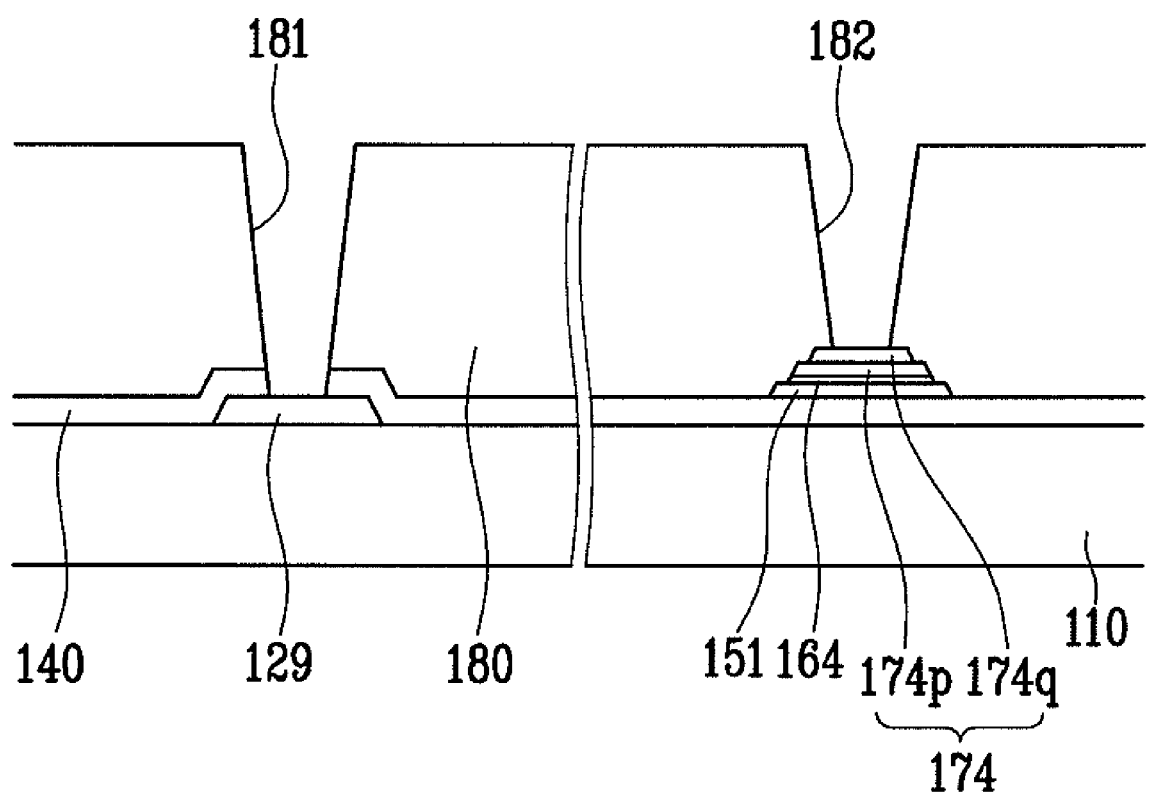

FIG. 4 is a layout view of a TFT array panel shown in FIGS. 1, 2, and 3 in during a manufacturing method thereof according to an embodiment of the present invention. FIGS. 5 and 6 are sectional views of the TFT array panel shown in FIG. 4 taken along the lines V-V and VI-VI. FIGS. 7 to 16 are sectional views of the TFT array panel in the step(s) following the step(s) shown in FIGS. 4 to 6, FIG. 17 is a layout view of the TFT array panel in the step(s) following the step(s) shown in FIGS. 15 and 16. FIGS. 18 and 19 are sectional views of the TFT array panel shown in FIG. 17 taken along the lines XVIII-XVIII and XIX-XIX. FIG. 20 is a layout view of the TFT array panel in the step(s) following the step shown in FIGS. 17 to 19. FIGS. 21 and 22 are sectional views of the TFT array panel shown in FIG. 20 taken along the lines XXI-XXI and XXII-XXII.

As shown in FIGS. 4 to 6, a plurality of gate lines 121, and a plurality of storage electrode lines 131 including a plurality of storage electrodes 133a and 133b, are formed on an insulating substrate 110 made of a material such as transparent glass or plastic.

The gate lines 121 and the storage electrode lines 131 may be made of four films of a lower Mo (alloy) film, a middle lower Cu film, a middle upper nitride Cu film, and an upper Mo (alloy) film, of three films of a lower Mo (alloy) film, a middle Cu film, and an upper Mo (alloy) film, a lower Cu (alloy) film, a middle Cu film, and an upper Cu (alloy), or a lower Mo (alloy) film, a middle Cu film, and an upper nitride Cu film, of two films of a lower Me (alloy) film and an upper Cu (alloy) film, or of a single film. The gate lines 121 and the storage electrode lines 131 are made of a single film including Cu or a Cu alloy, or of two films including the single film. An etchant used is a Cu etchant including ethylene glycol, sulfuric acid (H2SO4), nitric acid, and deionized water. The Cu etchant may include additives such as surfactants.

After deposition of a gate insulating layer 140, an intrinsic a-Si layer 150 and an extrinsic a-Si layer 160 are sequentially deposited by plasma enhanced chemical vapor deposition (PECVD). The intrinsic a-Si layer 150 is made of, for example, hydrogenated amorphous silicon, and the extrinsic a-Si layer 160 is made of, for example, n+ hydrogenated a-Si heavily doped with an N-type impurity such as phosphorous, or of silicide.

A conductive layer 170 including a lower conductive layer 170p made of, for example, a Mo-containing metal such, as Mo or a Mo alloy and an upper conductive layer 170q made of, for example, a. Cu-containing metal such Cu or a Cu alloy is then deposited by sputtering on the doped amorphous silicon layer 160.

Figure 9:
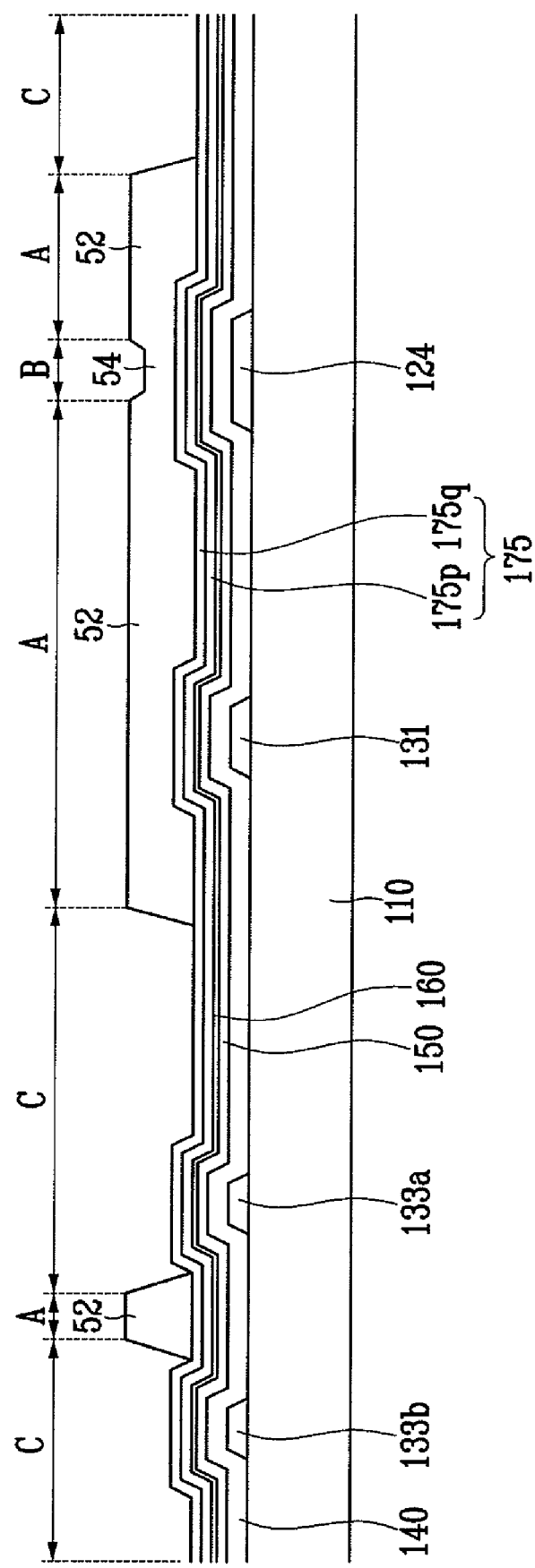
Figure 10:
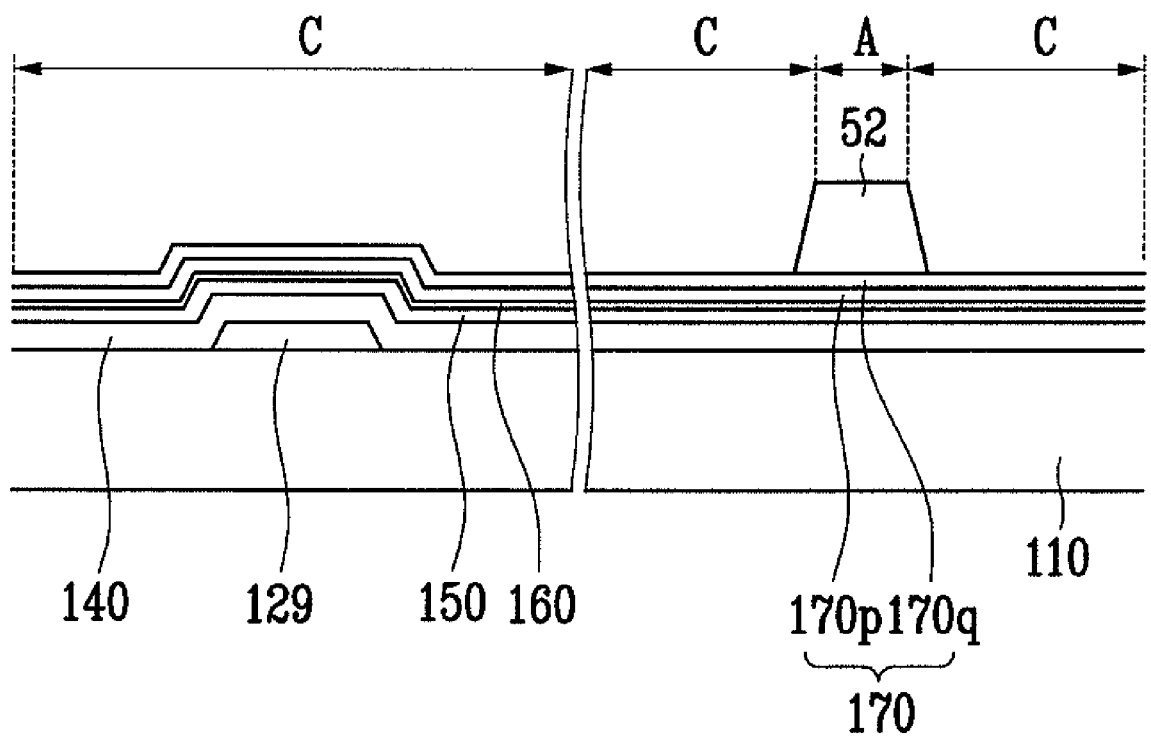
Figure 11:
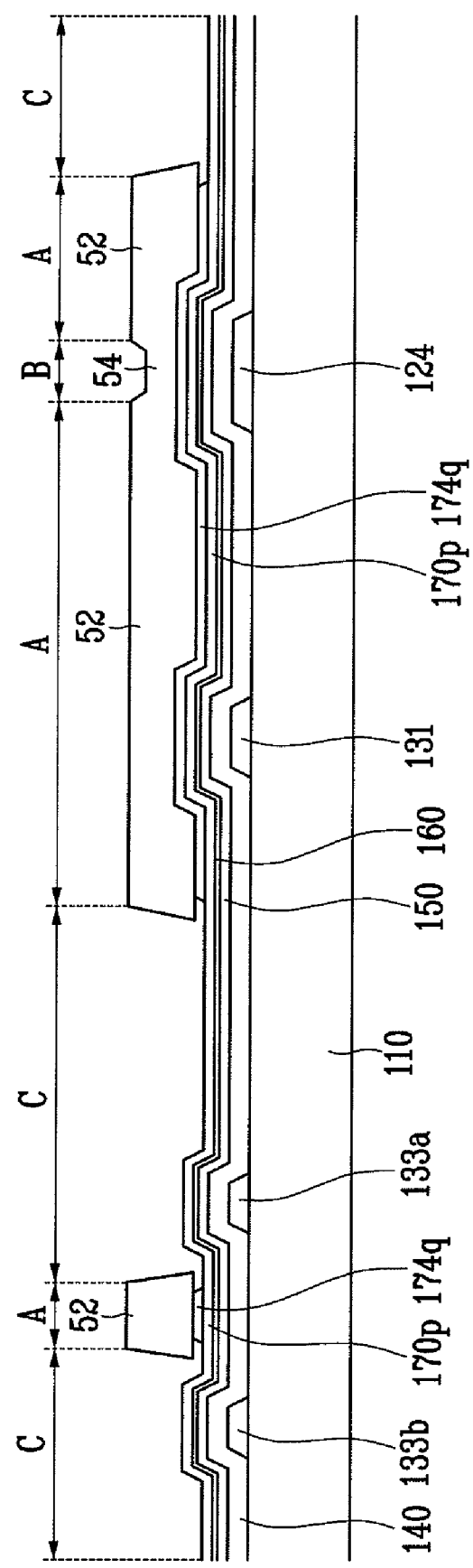
Figure 12:
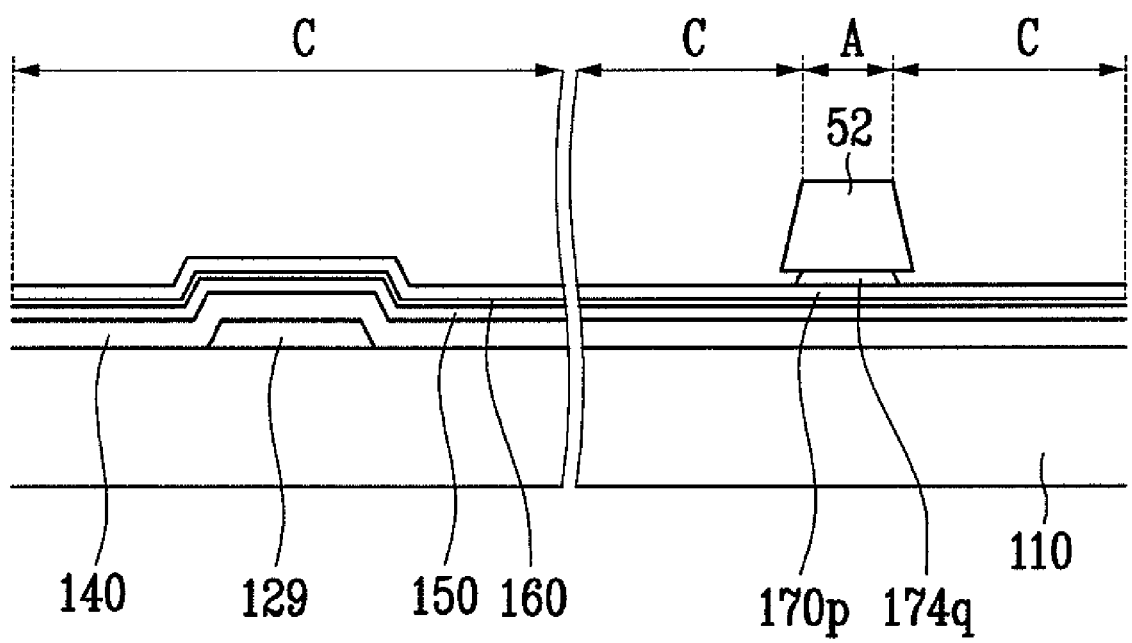
Figure 13:
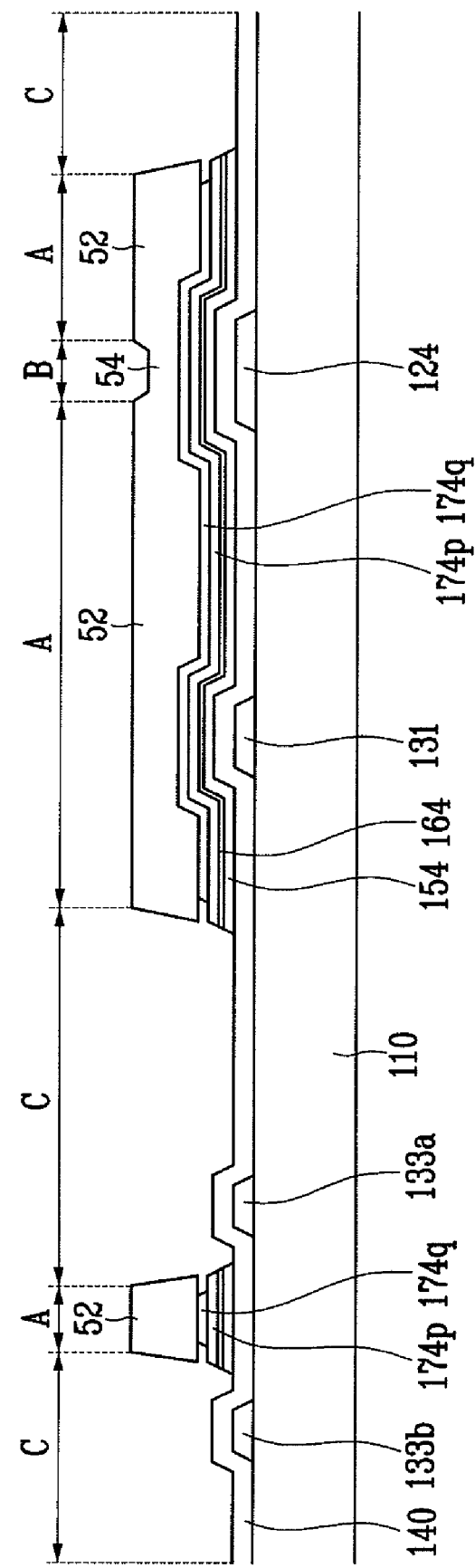
Figure 14:
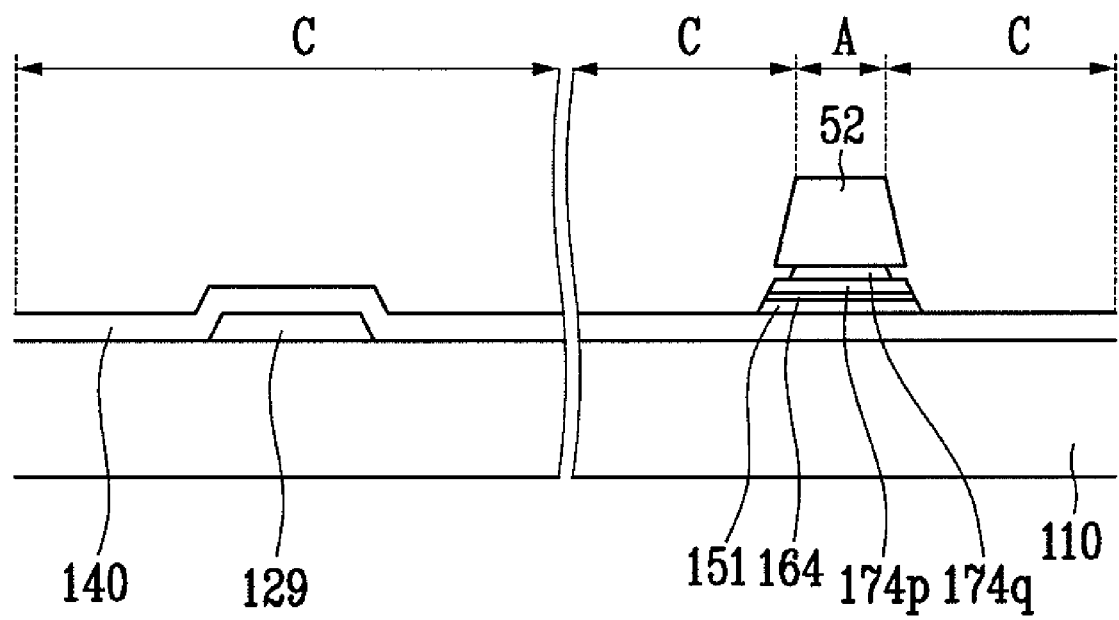

Referring to FIGS. 9 and 10, a photoresist film with a predetermined thickness is coated on the upper conductive layer 170q of the conductive layer 170, and is exposed to light through an exposure mask and developed to form a photoresist film 52, 54 having a position-dependent thickness.

The developed photoresist film 52, 54 has portions of different thicknesses. As shown in FIGS. 9 and 10, the developed photoresist film defines a plurality of portions, referred to herein as first, second, and third portions. The first portions are located on wire areas A and the second portions are located on channel areas 8, indicated by the elements of the photoresist film labeled by reference numerals 52 and 54, respectively. The third portions are located on the remaining areas C, where substantially all the photoresist film is removed, thus exposing underlying portions of the conductive layer 170. The thickness ratio of the photoresist film, at elements 54 and 52 is adjusted depending upon the process conditions in the subsequent process steps. For example, the thickness of the photoresist film at the second portions (i.e., at element 54) may be equal to or less than half of the thickness of the photoresist film at the first portions (i.e., at element 52), for example, with the thickness of about 1.5 μm.

For descriptive purposes, portions of the conductive layer 170, the extrinsic a-Si layer 160, and the intrinsic a-Si layer 150 in the areas A are called first portions, portions of the conductive layer 170, the extrinsic a-Si layer 160, and the intrinsic a-Si layer 150 in the areas C are called second portions, and portions of the conductive layer 170, the extrinsic a-Si layer 160, and the intrinsic a-Si layer 150 in the areas B are called third portions.

The position-dependent thickness of the photoresist is obtained by several techniques, for example by providing translucent areas on the exposure mask as well as transparent areas and light blocking opaque areas. The translucent areas may have a slit pattern or a lattice pattern, or they may be a thin film(s) with intermediate transmittance or intermediate thickness. When using a slit pattern, the width of the slits or the distance between the slits may be smaller than the resolution of a light exposer used for the photolithography.

Referring to FIGS. 11 to 14, the upper conductive layer 170$q$ of the conductive layer 170 of the third portions at remaining areas C are removed by wet etching to form an upper data pattern 174$q$. Because the wet etching is executed by isotropic etching, the upper data pattern 174$q$ is under-cut under the photoresist films 52 and 54. The etchant used for the wet etching is a Cu etchant including ethylene glycol at about 0.1-about 30 wt %, sulfuric acid (H2SO4) at about 0.1-about 30 wt %, nitric acid at about 1.0-about 70 wt %, and deionized water for the remainder, and may include additives such as surfactants. Because the Cu etchant has high etch selectivity between a Cu-containing metal, and Mo (alloy), Cr (alloy) and Al (alloy), only the upper data pattern 174$q$ is selectively etched and the lower conductive layer 170$p$ that may be formed of Mo, Cr, Al, or alloys thereof is not etched.

Next, the third portions of the extrinsic a-Si layer 160 and the intrinsic a-Si layer 150 on the remaining areas C and the lower conductive layer 170$p$, which is not covered by the upper data pattern 174$q$, are removed, for example, by dry etching.

Here, the semiconductor stripes 151, including the protrusions 154, are completed and a doped amorphous silicon pattern 164 and a lower data pattern 174$p$ which have the same plane shapes as the semiconductor stripes 151 are formed.

Figure 15:
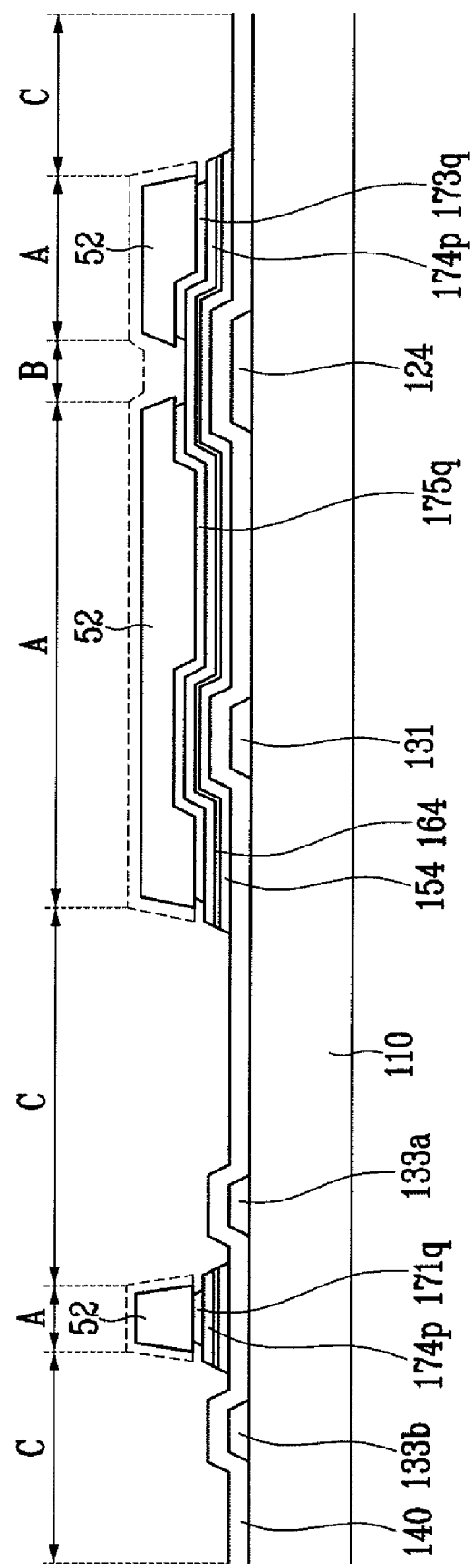
Figure 16:
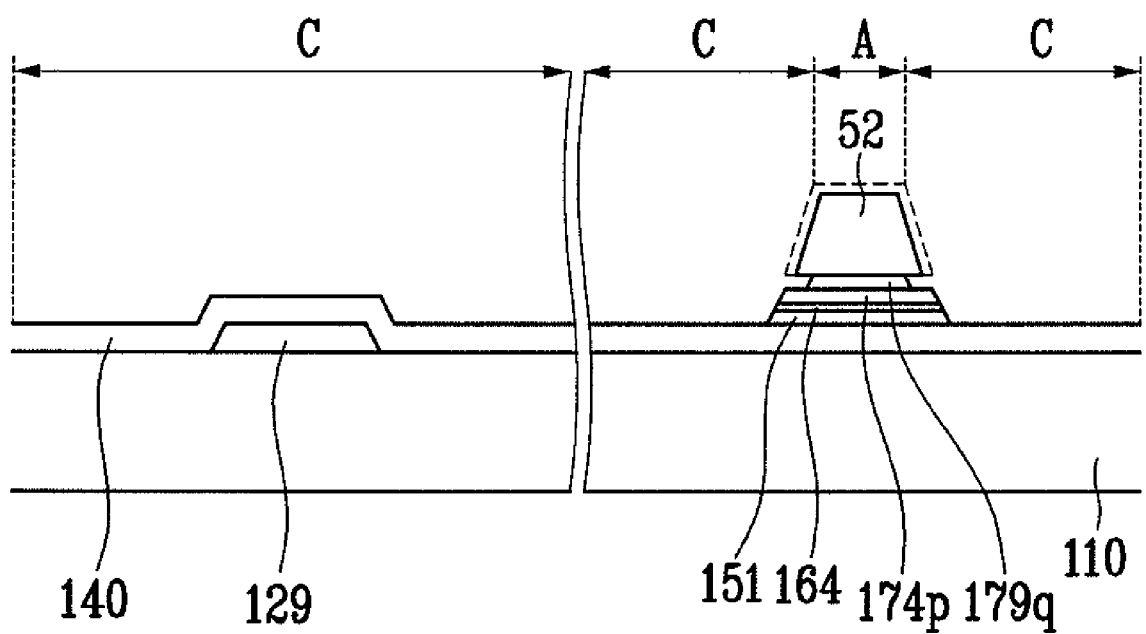

Next, as shown in FIGS. 15 and 16, the second, portions 54 of the photoresist on the channel areas B are removed by an etch-back process to expose the second portions of the upper data pattern 174$q$. At the same time, some amount of the exposed portions of the photoresist film at the first portion 52 is removed, thereby decreasing the thickness of the remaining photoresist film. Residue of the second portions 54 of the photoresist remaining on the channel areas 8 may be removed by ashing.

Next, the exposed, portion of the upper data pattern 174$q$ is etched with the Cu etchant to complete the upper layers 171$q$, 173$q$, and 175$q$ of the data lines 171 and the drain electrodes 175.

In FIGS. 15 and 16, the dotted line indicates the portion removed by the etch-back process and the solid line indicates the remaining portion of the photoresist films. Because the wet etching is also executed by isotropic etching, the upper layers 171$q$, 173$q$, 175$q$ of the data lines 171 and the drain electrodes 175 are under-cut under the photoresist films 52.

Figure 17:
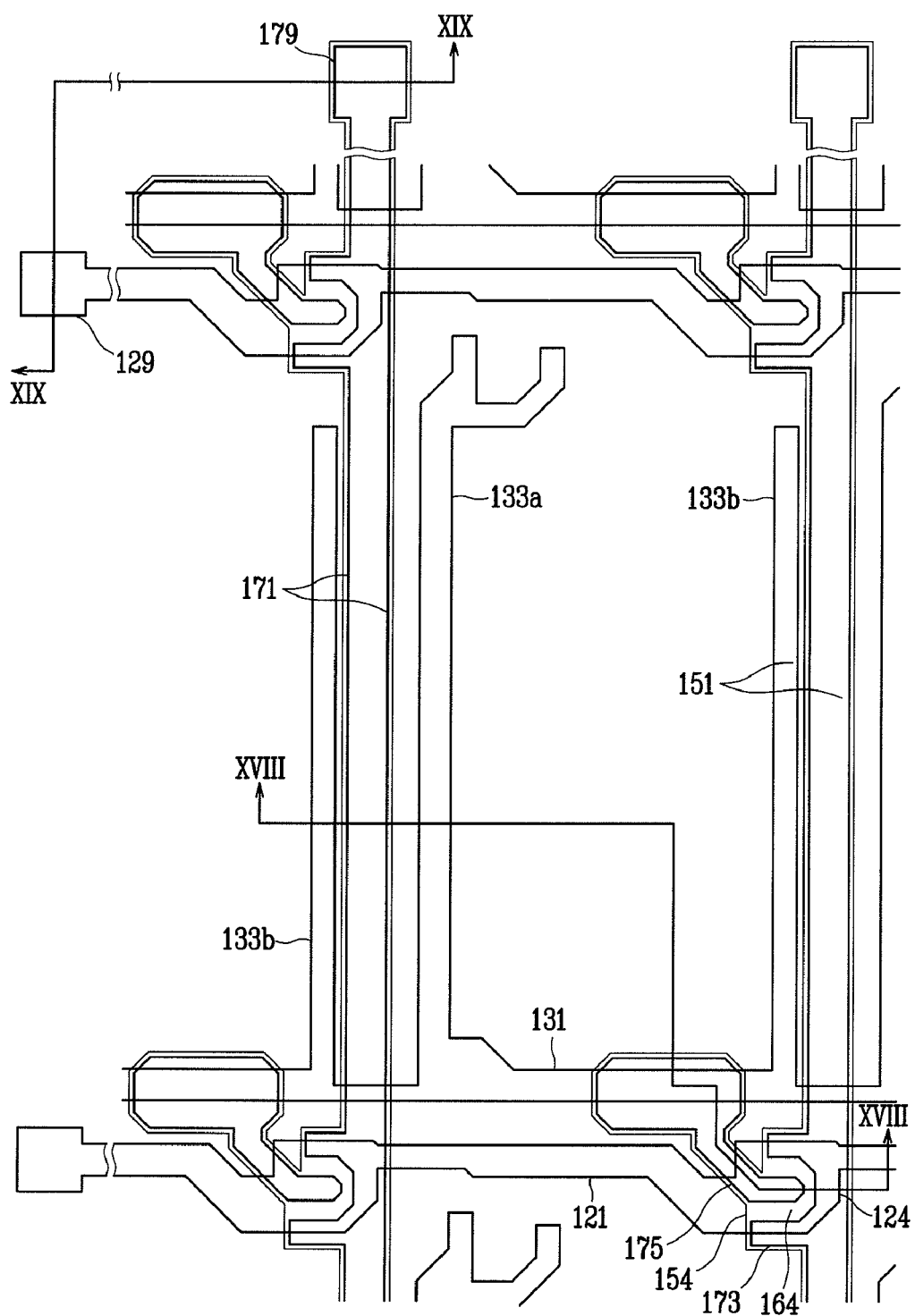
FIG. 17 is a layout view of the TFT array panel at a step(s) of a manufacturing process following the step(s) shown in FIGS. 15 and 16.
Figure 18:
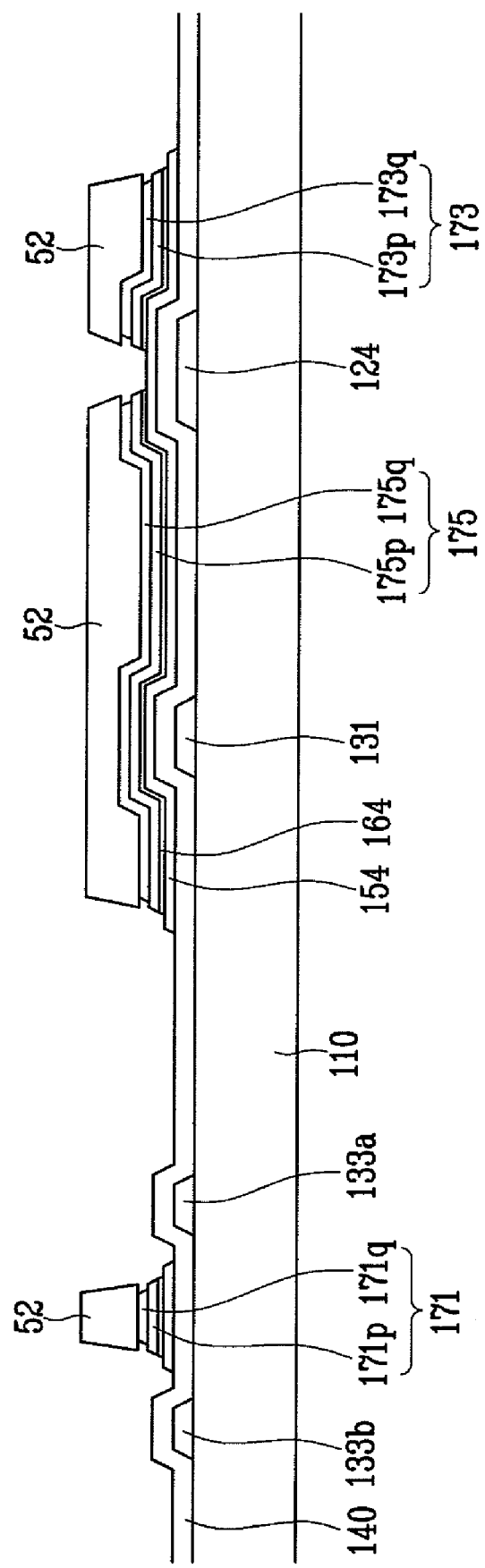
FIGS. 18 and 19 are sectional views of the TFT array panel shown in FIG. 17 taken along the lines XVIII-XVIII and XIX-XIX, respectively.
Figure 19:
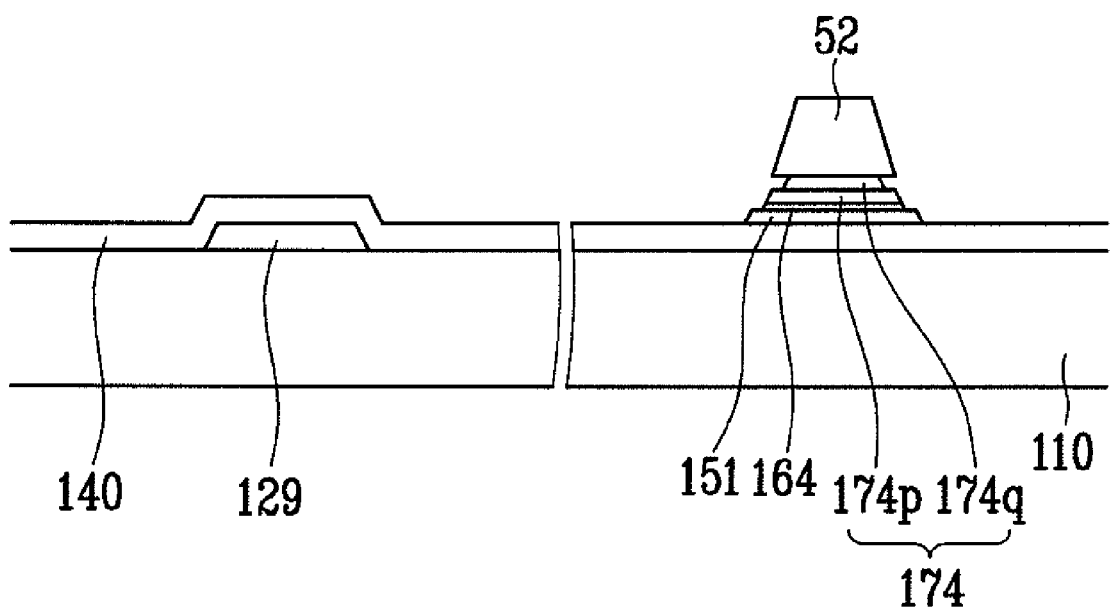

Next, as shown in FIGS. 17 to 19, the lower data pattern 174$p$ is dry-etched by using the photoresist film 52 as an etch mask to complete the lower layers 171$p$, 173$p$, 175$p$ of the data lines 171 and the drain electrodes 175.

Then, the first portions 52 of the photoresist are removed.

Next, the portions of the doped amorphous silicon pattern 164 between the source electrode 173 and the drain electrode 175 are removed to divide it into an ohmic contact stripe 161 and a plurality of ohmic contact islands 165. The removal of the portions of the doped amorphous silicon pattern 164 may be performed without the removal of the first portions of the photoresist film.

As described above, the upper layer including Cu at the drain electrode 175 and the data line 171 is wet-etched by using the Cu etchant having the particular etch selectively for the Cu layer, and the lower layer is dry-etched in a manufacturing method according to an embodiment of the present invention. Accordingly, the circumference portion of the semiconductor stripes 151 is covered by the lower layers 171$p$, 173$p$, and 175$p$ having wide areas of two layers of the data lines 171 and the drain electrodes 175 such that the width of the semiconductor stripes 151 that is not covered by the data lines 171 and the drain electrodes 175 may be minimized to less than about 0.5 μm, and afterimage and waterfall phenomena may be minimized, and the aperture ratio of the pixels may be maximized. When the upper layer cannot be selectively etched, differently from embodiments of the present invention, the circumference of the semiconductor stripes 151 are exposed with a broadened width from, the data lines 171 and the drain electrodes 175.

On the other hand, a Cu layer made of Cu or a Cu alloy and a Mo layer made of Mo or a Mo alloy may be etched together by using a Cu etchant including hydrogen peroxide. The upper layer 170$q$ and the lower layer 170$p$ are etched together when the third portions of the conductive layer 170 are firstly etched by using the photoresist films 52 and 54 as an etch mask, and most of the remaining steps can include the same steps as the manufacturing method, described in connection with FIGS. 13 to 19.

Referring to FIGS. 20 to 22, a passivation layer 180 is formed to cover the projections 154 that are not covered by the data lines 171 and the drain electrodes 175. The passivation layer 180 is made of, for example, an inorganic material such as silicon nitride and silicon oxide. Also, the passivation layer 180 may include a lower layer made of an inorganic material and an upper layer made of an organic material, or may he only made of an organic material. The organic material may have photosensitivity and a dielectric constant of less than 4.0.

Thereafter, selected portions of the passivation layer 180 and the gate insulating layer 140 are patterned to form a plurality of contact holes 181, 182, 183$a$, 183$b$, and 185.

Finally, as shown in FIGS. 1 to 3, a plurality of pixel electrodes 191, a plurality of contact assistants 81 and 82, and a plurality of overpasses 83 are formed on the passivation layer 180 by sputtering and patterning to form an ITO or IZO layer.

Figure 24:
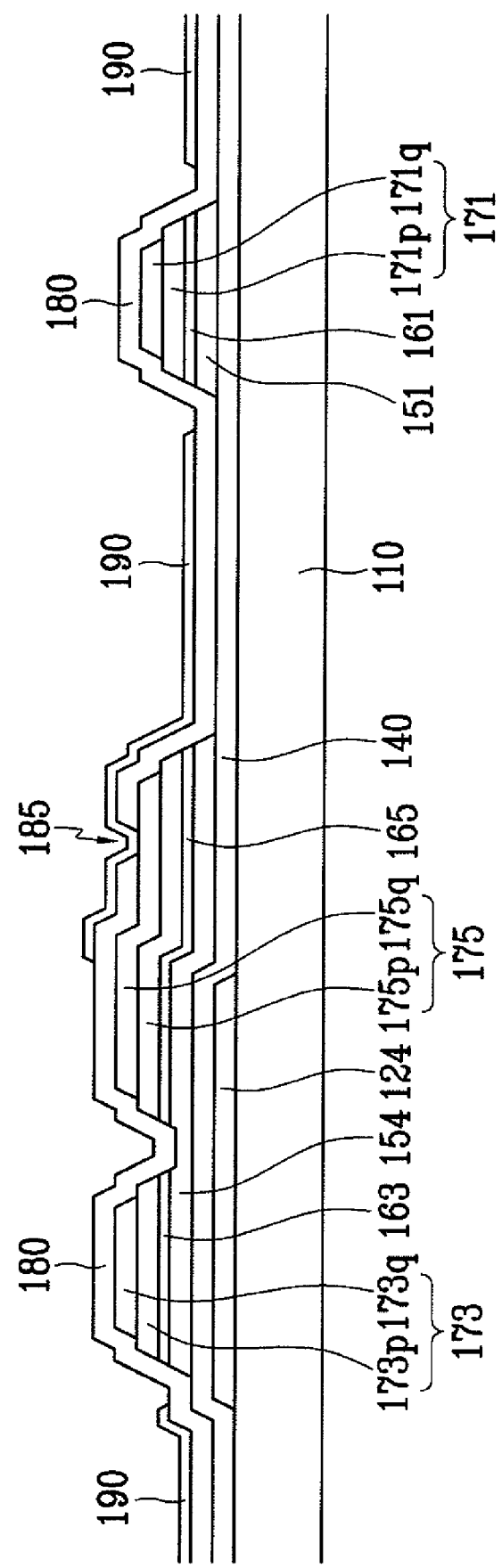
FIGS. 24 and 25 are sectional views of the TFT array panel shown in FIG. 23, taken along the lines XXIV-XXIV and XXV-XXV'-XXV", respectively.
Figure 25:
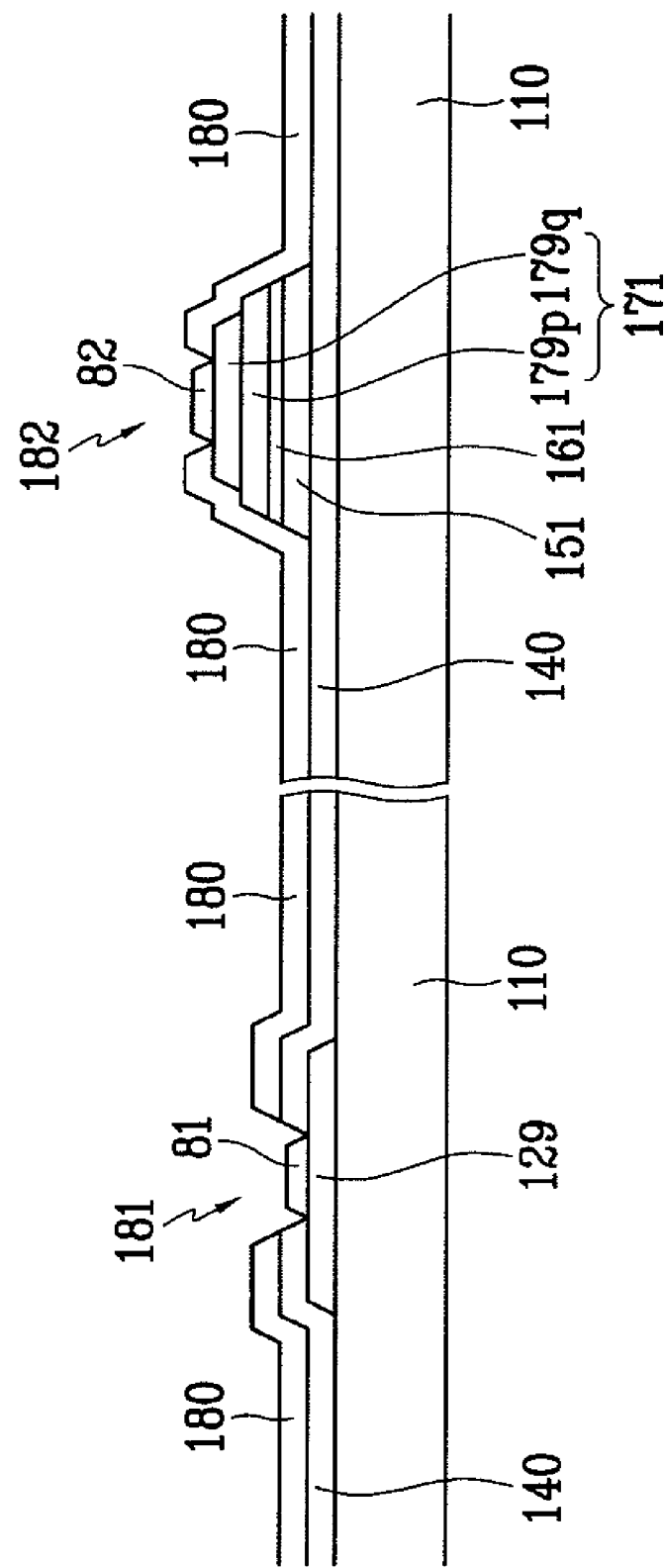

A TFT array panel according to an embodiment of the present invention will be described in detail with reference to FIGS. 23 to 25.

Figure 23:
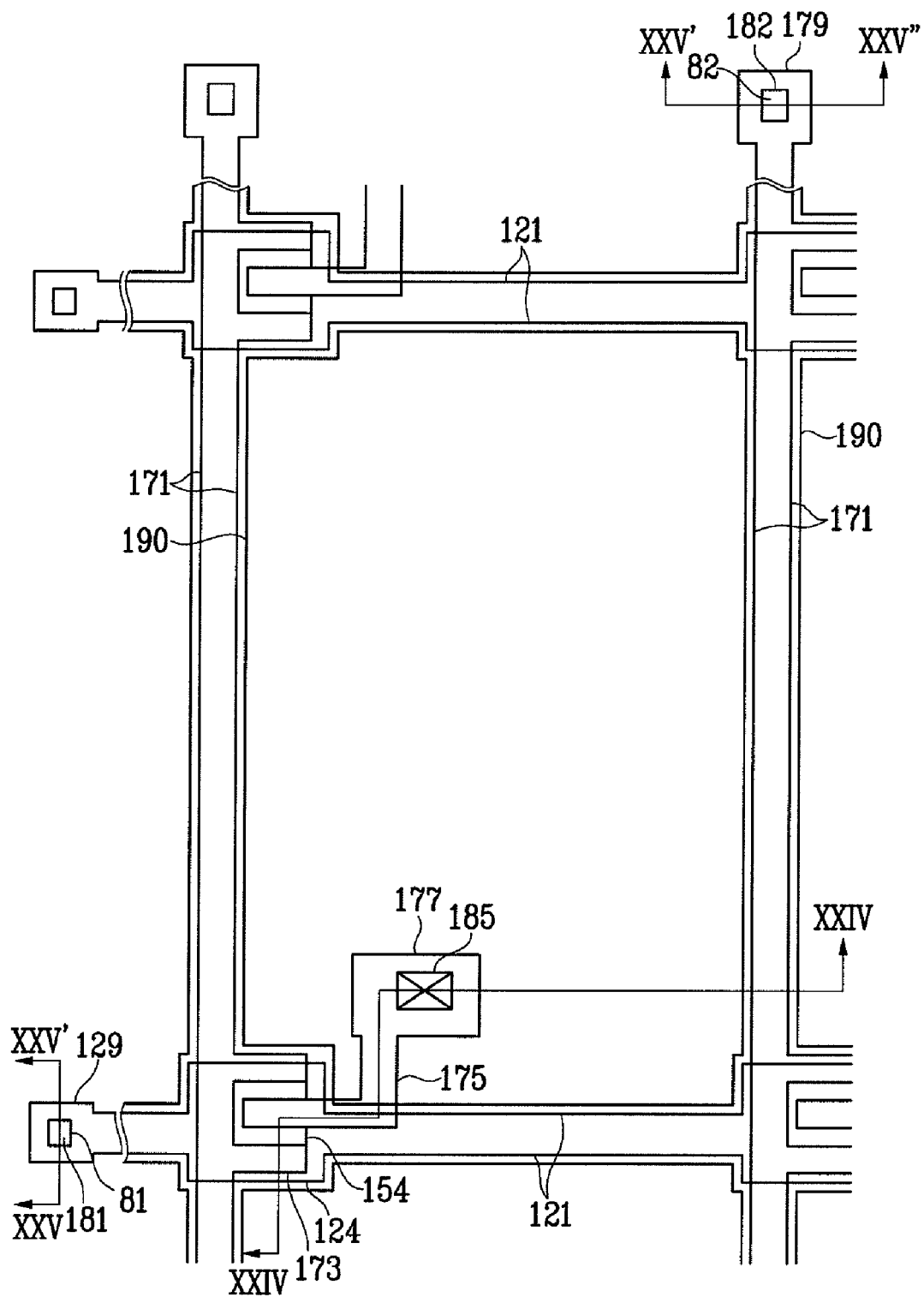
FIG. 23 is an exemplary layout view of a TFT array panel for a liquid crystal display according to an embodiment of the present invention.

FIG. 23 is a layout view of a TFT array panel according to an embodiment of the present invention. FIG. 24 is a sectional view of the TFT array panel shown in FIG. 23 taken along the line XXIV-XXIV, and FIG. 25 is a sectional view of the TFT array panel shown in FIG. 23 taken along the lines XXV-XXV'-XXV".

A plurality of gate lines 121 are formed on an insulating substrate 110 made of a material such as transparent glass.

A plurality of semiconductor stripes 151 having a plurality of projections 154, and a plurality of ohmic contact stripes and islands 161 and 165 are formed on a gate insulating layer 140 covering the gate lines 121.

A plurality of data lines 171 and a plurality of drain electrodes 175 separated from the data lines 171 are formed on the ohmic contacts 161 and 165.

Each drain electrode 175 has a wide end portion 177 and a linear end portion. The wide end portion 177 has a relatively large area and the linear end portion is partly enclosed by a source electrode 173. As shown in FIG. 23, the source electrode 173 may be curved.

The semiconductor stripes 151 have almost the same planar shapes as the data lines 171 and the drain electrodes 175 as well as the underlying ohmic contacts 161 and 165. However, the projections 154 of the semiconductor stripes 151 include some exposed portions that are not covered with the data lines 171 and the drain electrodes 175, such as portions located between the source electrodes 173 and the drain electrodes 175. The structure in which the portions exposed by the data lines 171 and the drain electrodes 175 are removed will be described hereinafter with reference to the drawings.

A passivation layer 180 is formed on the data lines 171, the drain electrodes 175, and the exposed portions of the semiconductor stripes 151.

The passivation layer 180 has a plurality of contact holes 182 and 185 exposing the end portions 179 of the data lines 171 and parts of the drain electrodes 175, respectively. The passivation layer 180 and the gate insulating layer 140 have a plurality of contact holes 181 exposing parts of the end portions 129 of the gate lines 121.

A plurality of pixel electrodes 191 and a plurality of contact assistants 81 and 82 are formed on the passivation 180.

Now, a method of manufacturing the TFT array panel shown in FIGS. 23 to 25 according to an embodiment of the present invention will be described in detail with reference to FIGS. 26 to 42 as well as FIGS. 23 to 25.

Figure 26:
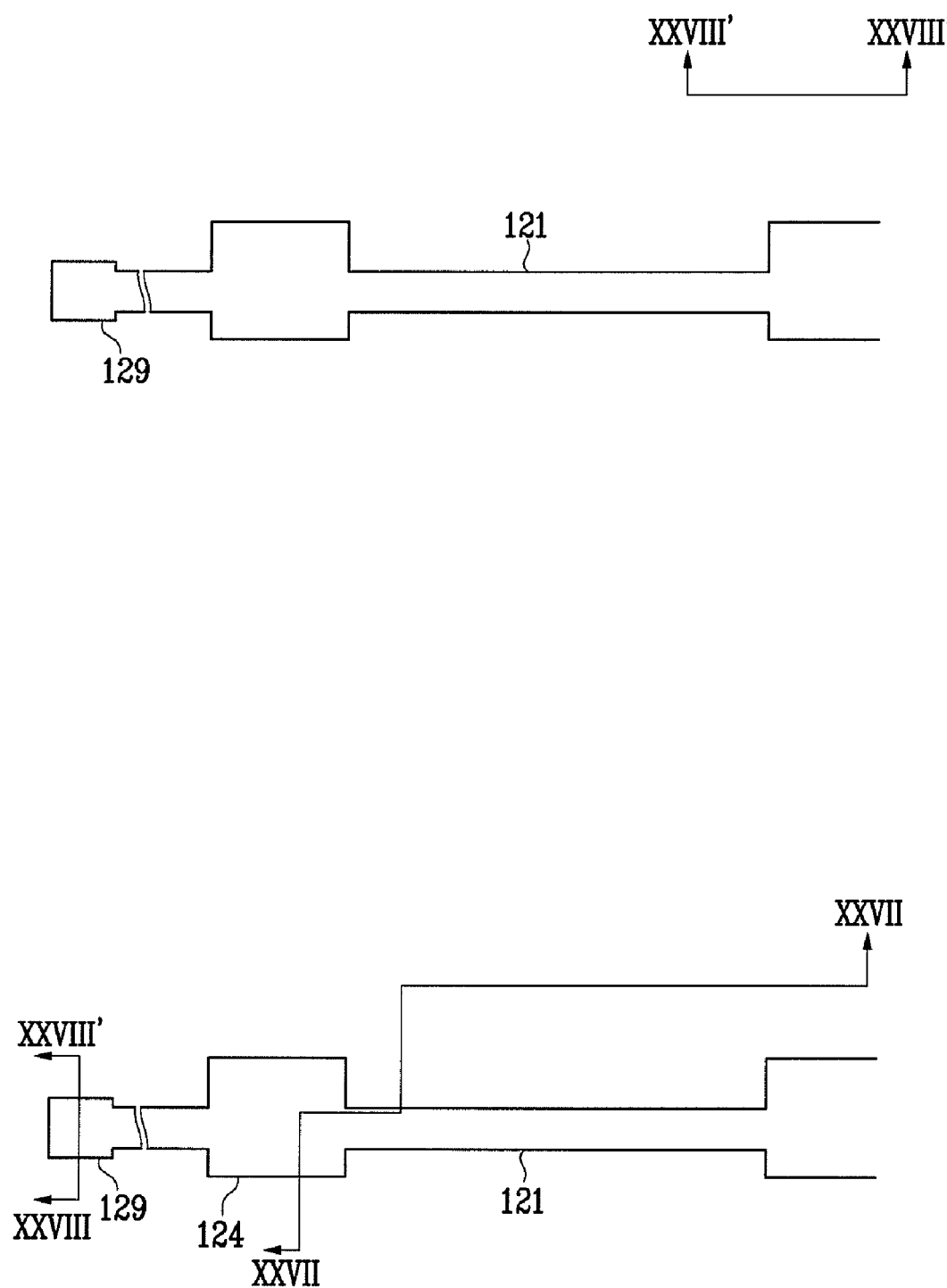
FIG. 26 is a layout view of the TFT array panel shown in FIG. 23 during a manufacturing method thereof according to an embodiment of the present invention.
Figure 27:
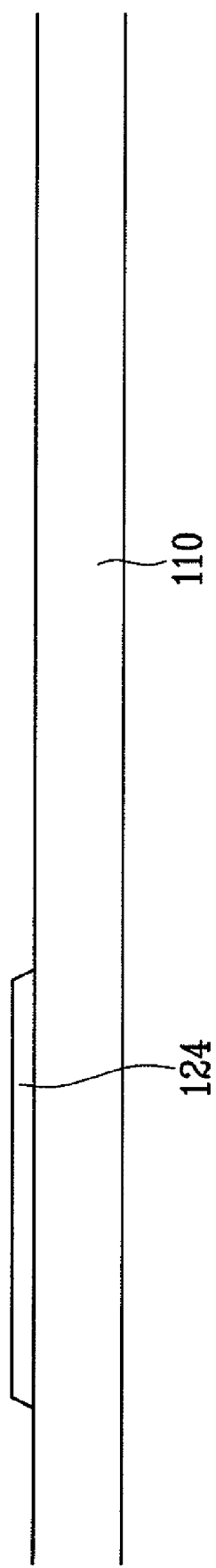
FIGS. 27 and 28 are sectional views of the TFT array panel shown in FIG. 26 taken along the lines XXVII-XXVII and XXVIII-XXVIII'-XXVIII", respectively.
Figure 28:
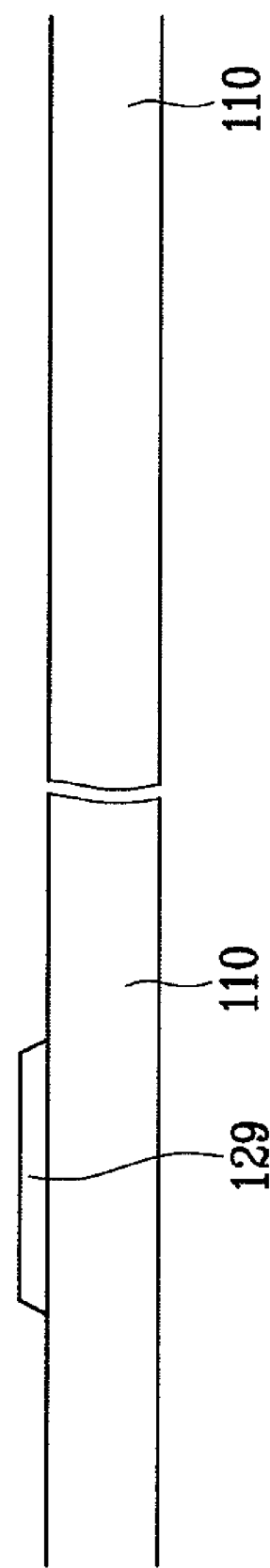
Figure 33:
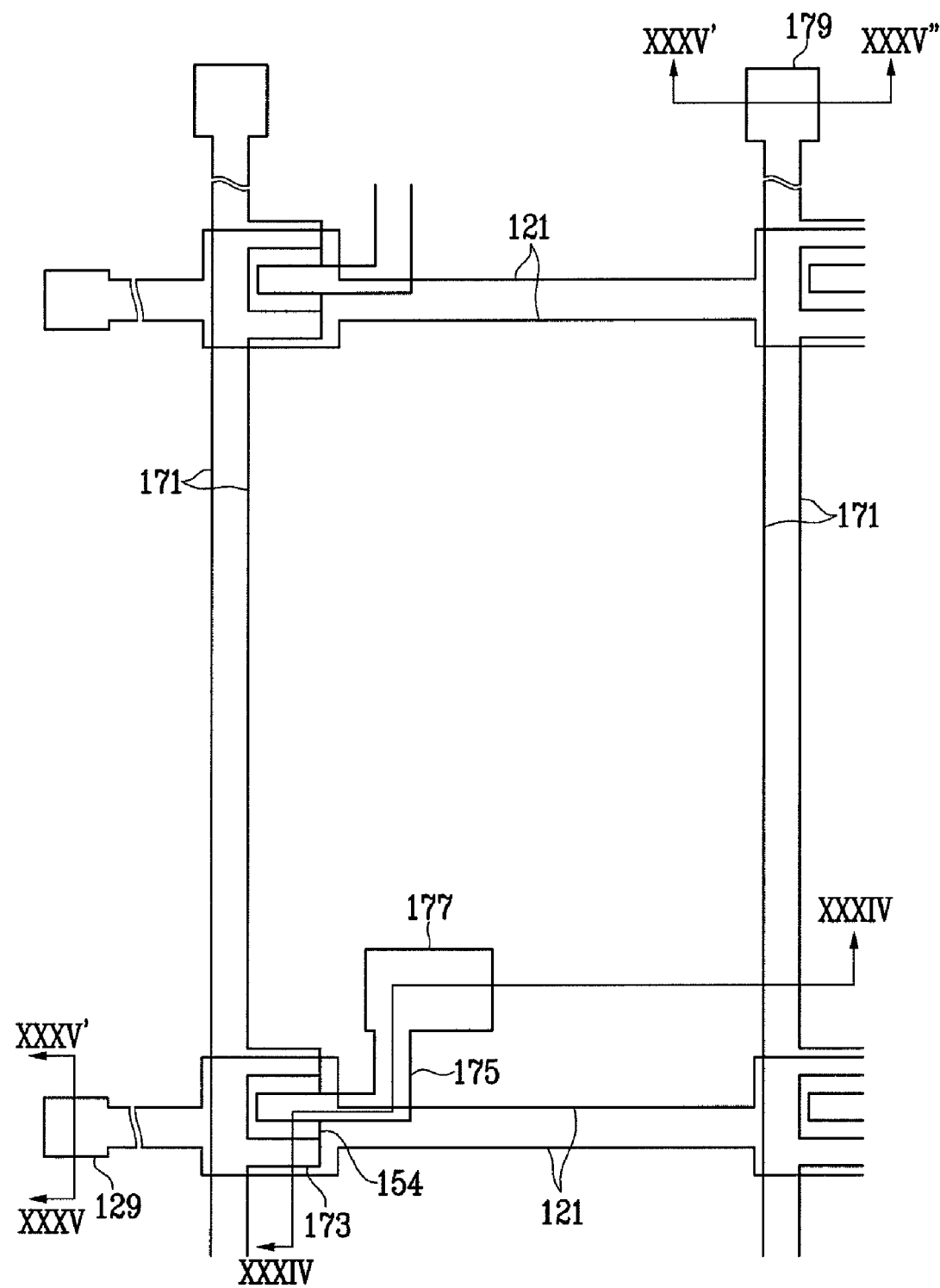
FIG. 33 is a layout view of the TFT array panel at a step(s) following the step(s) shown in FIGS. 31 and 32.
Figure 34:
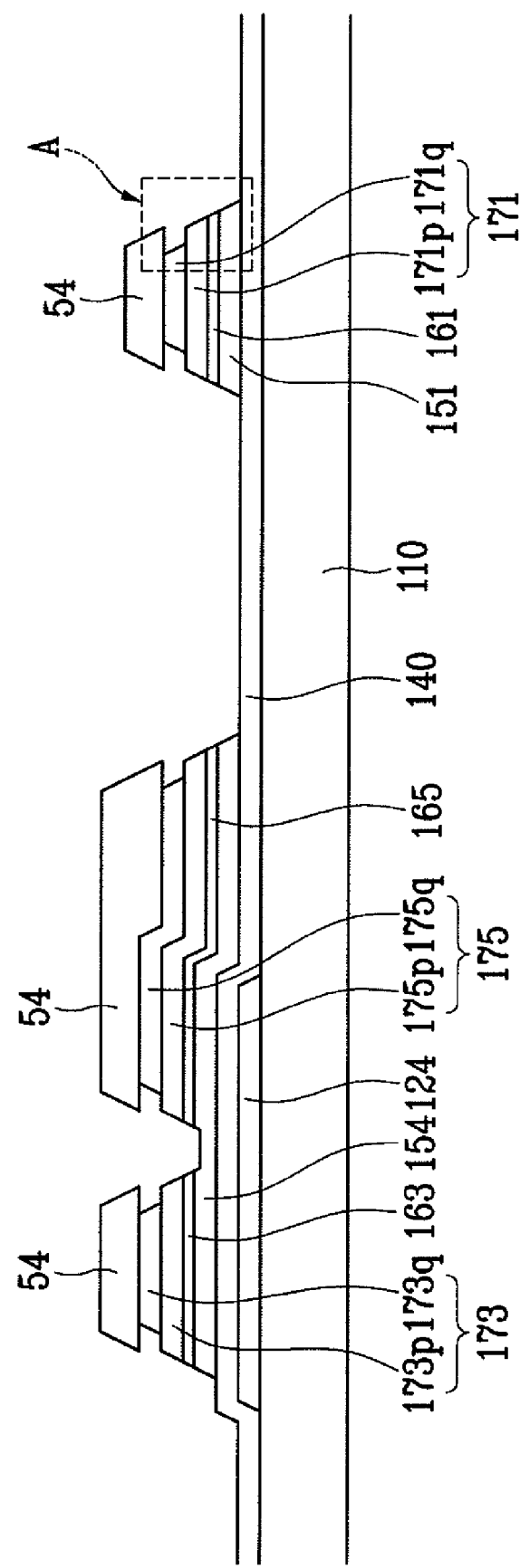
FIGS. 34 and 35 are sectional views of the TFT array panel shown in FIG. 33 taken along the lines XXXIV-XXXIV and XXXV-XXXV'-XXXV", respectively.
Figure 35:
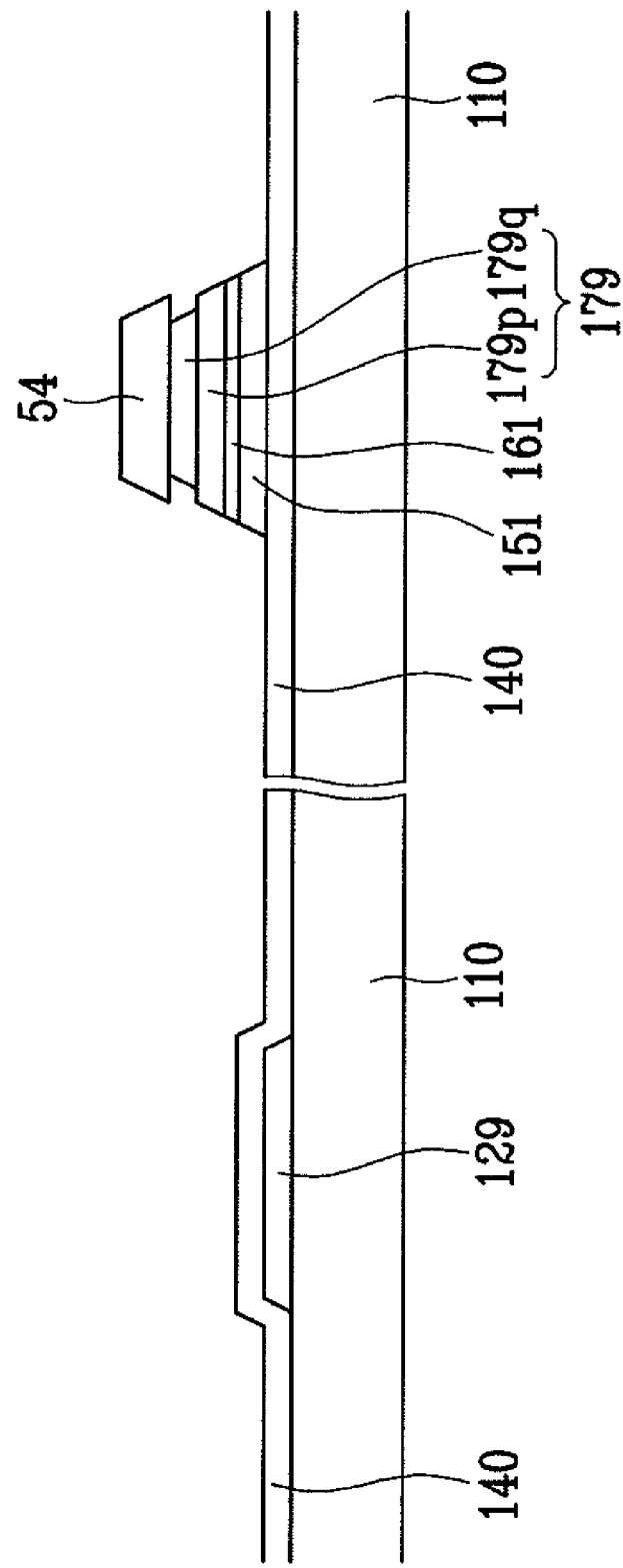
Figure 36:
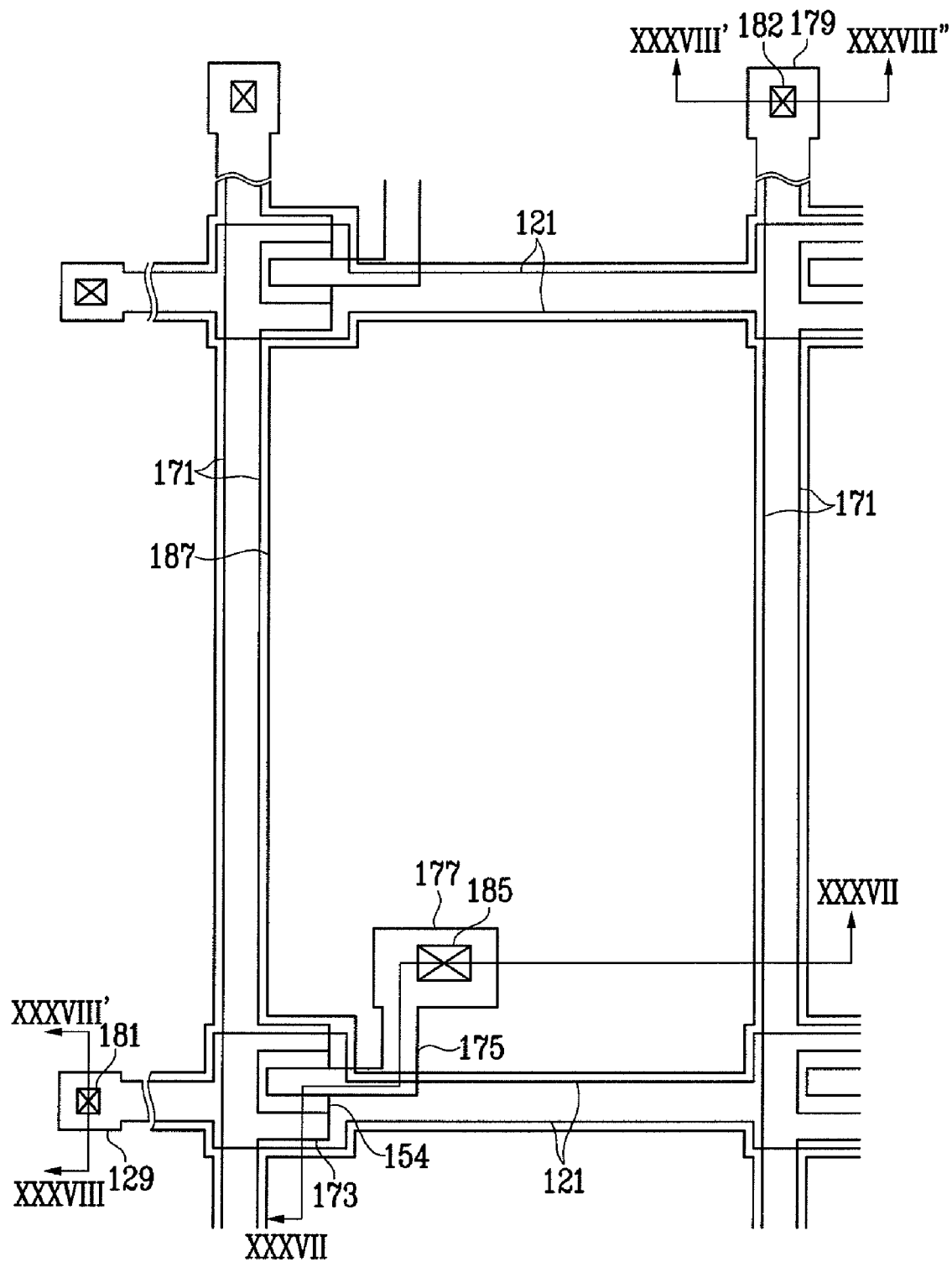
FIG. 36 is a layout view of the TFT array panel at a step(s) following the step(s) shown in FIGS. 34 and 35.
Figure 37:
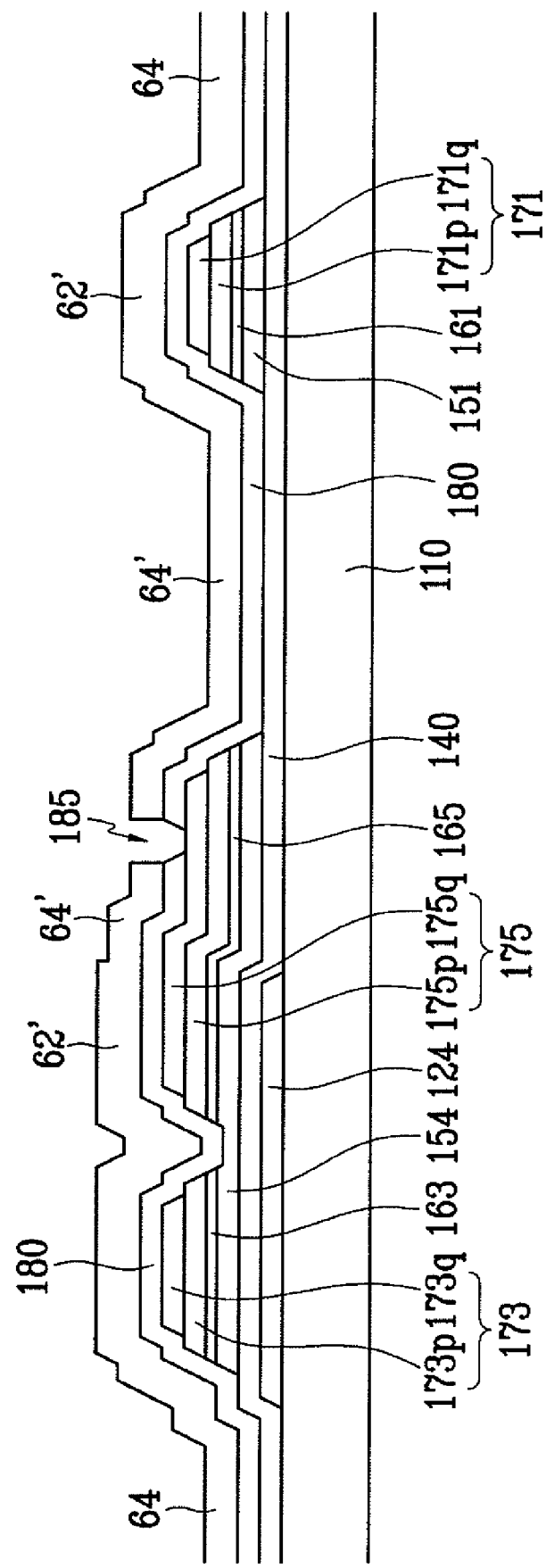
FIGS. 37 and 38 are sectional views of the TFT array panel shown in FIG. 36 taken along the lines XXXVII-XXXVII and XXXVIII-XXXVIII'-XXXVIII", respectively.
Figure 38:
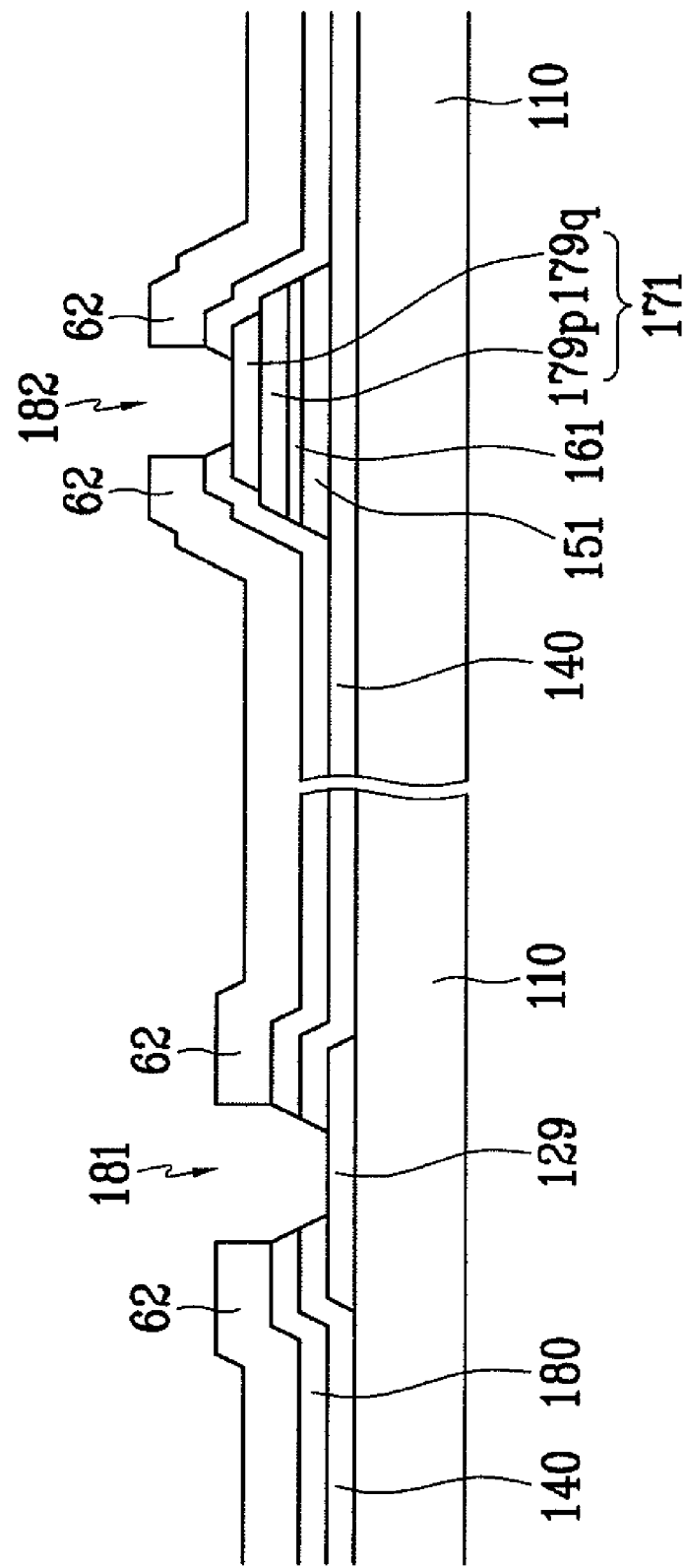

FIG. 26 is a layout view of the TFT array panel shown in FIG. 23 during a manufacturing method thereof according to an embodiment of the present invention. FIGS. 27 and 28 are sectional views of the TFT array panel shown in FIG. 26 taken along the lines XXVII-XXVII and XXVIII-XXVIII'-XXVIII". FIGS. 29 to 32 are sectional views of the TFT array panel in the step(s) following the step(s) shown in FIGS. 27 and 28. FIG. 33 is a layout view of the TFT array panel in the step(s) following the step(s) shown in FIGS. 31 and 32. FIGS. 34 and 35 are sectional views of the TFT array panel shown in FIG. 33 taken along the lines XXXIV-XXXIV and XXXV-XXXV'-XXXV". FIG. 36 is a layout view of the TFT array panel in the step(s) following the step(s) shown in FIGS. 34 and 35. FIGS. 37 and 38 are sectional views of the TFT array panel shown in FIG. 36 taken along the lines XXXVII-XXXVII and XXXVIII-XXXVIII'-XXXVIII". FIGS. 39 to 42 are sectional views of the TFT array panel in the step(s) following the step(s) shown in FIGS. 37 and 38, and FIG. 43 is a sectional view showing a portion A of the signal line in the TFT array panel.

Referring to FIGS. 26 to 28, a conductive layer made of, for example, metal is deposited on an insulating substrate 110 made of, for example, transparent glass, by sputtering, etc. The conductive layer may have a thickness of about 1000 Å-about 3000 Å. The conductive layer is then subjected to lithography and etching to form a plurality of gate lines 121 including gate electrodes 124 and an end portion 129.

Figure 29:
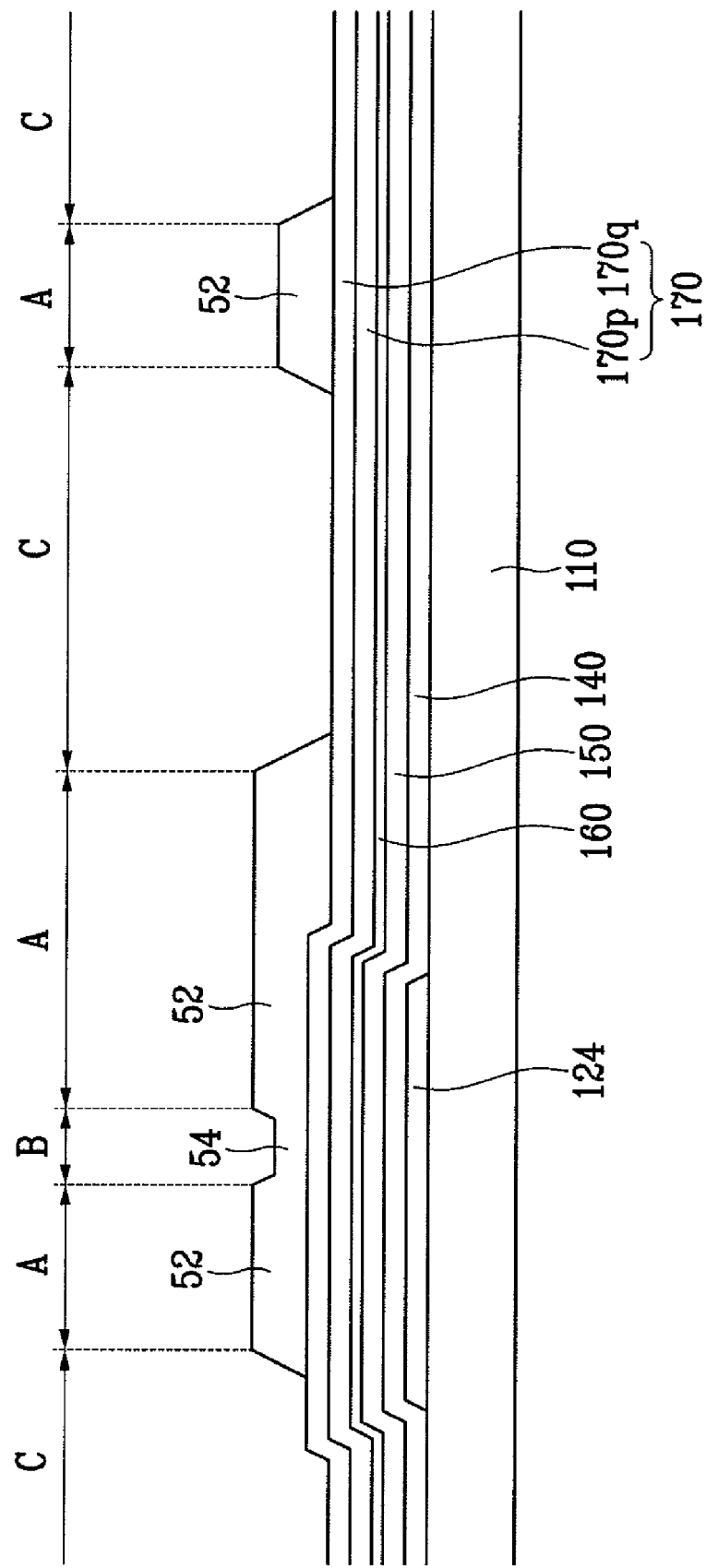
FIGS. 29 to 32 are sectional views of the TFT array panel at a step following the step shown in FIGS. 27 and 28.
Figure 30:
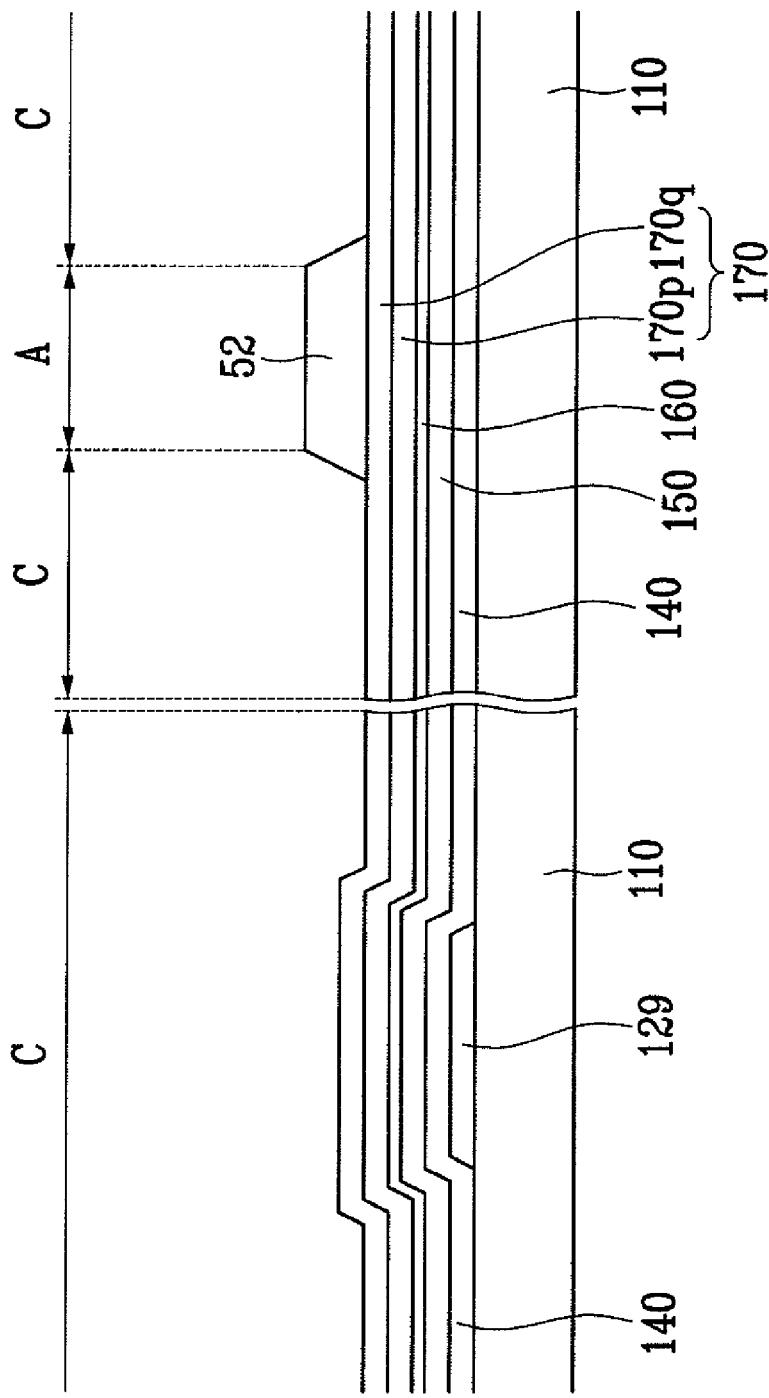

Referring to FIGS. 29 and 30, a gate insulating layer 140, an intrinsic a-Si layer 150, and an extrinsic a-Si layer 160 are sequentially deposited by CVD. The gate insulating layer 140 is made of, for example, silicon nitride and has a thickness of about 2000 Å-about 5000 Å. The deposition temperature of the gate insulating layer 140 is in a range of about 250° C.-about 400° C.

A conductive layer 170 including a lower layer 170p made of, for example, Mo or a Mo alloy and an upper layer 170q made of, for example, Cu or a Cu alloy is then deposited by sputtering, etc., and a photoresist film with a thickness of about 1 micron-about 2 microns is coated on the conductive layer 170. The photoresist film is exposed to light through a photo mask (not shown), and developed such that the developed photoresist has a position-dependent thickness. The photoresist film, includes a plurality of first to third portions in order of decreasing thickness. The first portions located on wire areas A and the second portions located on channel areas B are indicated by reference numerals 52 and 54, respectively, and no reference numeral is assigned to the third portions located on remaining areas C since they have zero or substantially zero thickness to expose underlying portions of the conductive layer 170, as in previous embodiments.

Figure 31:
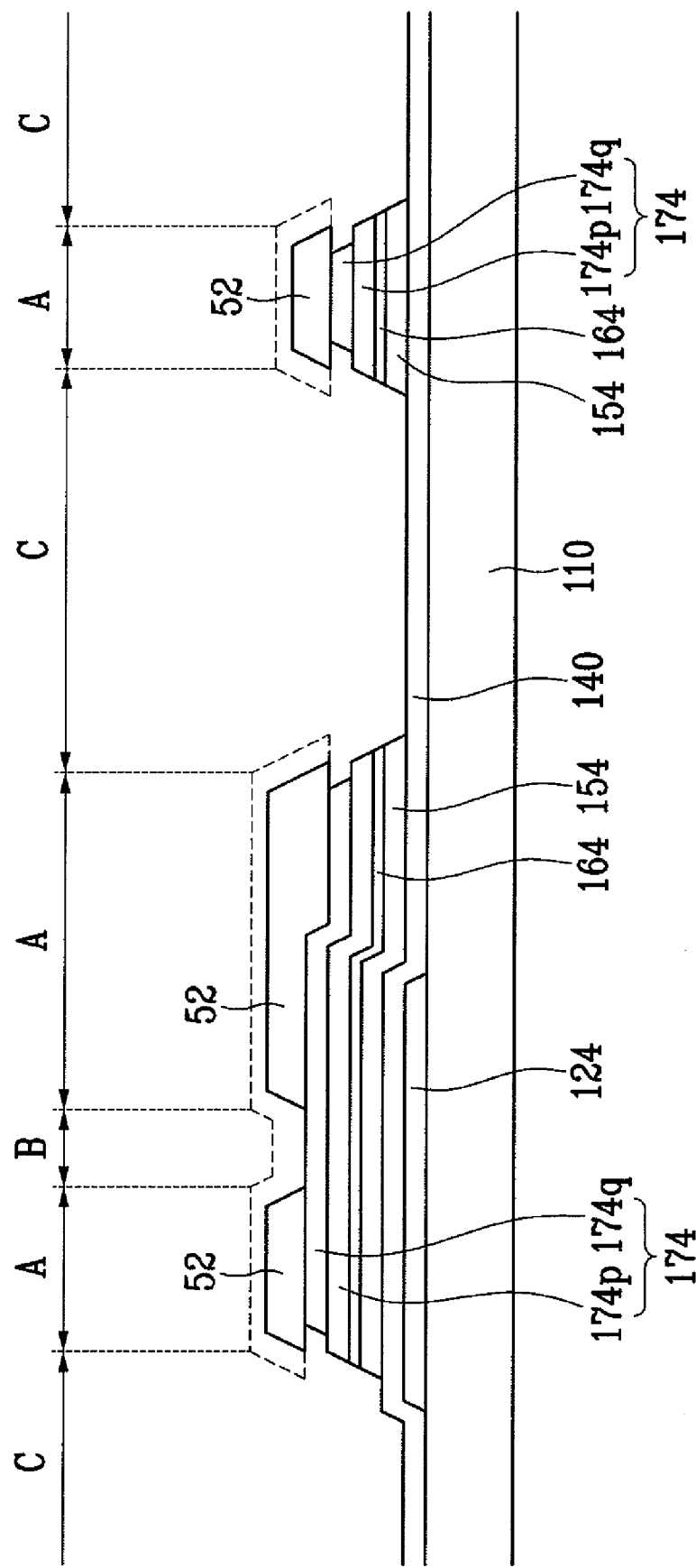
Figure 32:
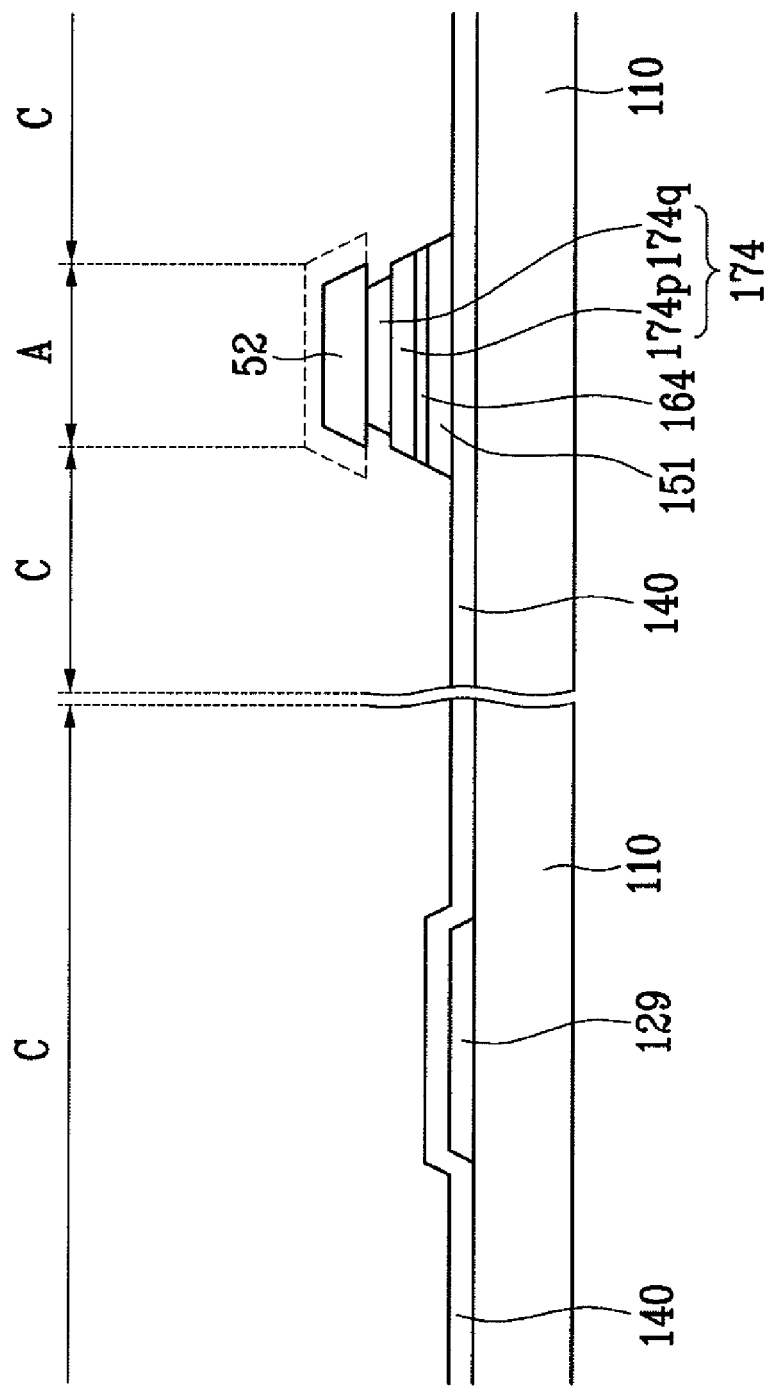

Referring to FIGS. 31 and 32, the upper conductive layer 170q of the conductive layer 170 of the third portions at remaining areas C are removed by wet etching using the Cu etchant used in the previous embodiment to form an upper data pattern 174q. Because the wet etching is executed by isotropic etching, the upper data pattern 174q is under-cut under the photoresist films 52 and 54. Because the Cu etchant has the high etch selectivity for a Cu-containing metal, only the upper data pattern 174q is selectively etched.

Next, the second, portions 54 of the photoresist on the channel areas B are removed by an etch-back process to expose the second portions of the upper data pattern 174q. At the same time, some amount of the exposed portions of the photoresist film at the first portion 52 is removed, thereby decreasing the thickness of the remaining photoresist film. Residue of the second portions 54 of the photoresist remaining on the channel areas B may be removed by ashing. Here, the dotted line indicates the portion removed by the etch-back process and the solid line indicates the remaining portion of the photoresist films.

Next, the third portions of the lower conductive layer 170p of the conductive layer 170, the extrinsic a-Si layer 160, and the intrinsic a-Si layer 150 on the remaining areas C are removed, preferably by dry etching. Here, the semiconductor stripes 151 including the protrusions 154 are completed and a doped amorphous silicon pattern 164 and a lower data pattern 174p of the data pattern 174 which have the same plane shapes as the semiconductor stripes 151 are formed.

Referring to FIGS. 33 to 35, the upper data pattern 174q of the data pattern 174 is wet-etched using the photoresist film 52 as an etch mask with the Cu etchant to expose the lower data pattern 174p of the channel areas B. Next, the exposed lower data pattern 174p is etched to complete a plurality of data lines 171 including a plurality of source electrodes 173 and a plurality of end portions 179, and a plurality of drain electrodes 175.

Then, the first portions 52 of the photoresist are removed.

Next the portions of the doped amorphous silicon pattern 164 between the source electrode 173 and the drain electrode 175 are removed to divide it into an ohmic contact stripe 161 and a plurality of ohmic contact islands 165. The removal of the portions of the doped amorphous silicon pattern 164 may be performed without the removal of the first portions of the photoresist film.

As shown in FIG. 43, the upper layers 171q, 173q, 175q, and 179q of the data lines 371 and the drain electrodes 175 that are wet-etched have a tapered slope angle γ of about 40 degrees to about 60 degrees, the lower layers 171p, 173p, 175p, and 179p of the data lines 171 and the drain electrodes 175 that are wet-etched have a tapered angle β of about 80 degrees to about 90 degrees, and the amorphous silicon layers 161 and 151 have a tapered, angle α of about 50 degrees to about 70 degrees.

In this embodiment, the upper layer of the data lines 171 and the drain electrodes 175 is wet-etched, and the lower layer of the data lines and the drain electrodes 175, and the semiconductor stripes 151, are dry-etched. Accordingly, the data lines 171 and the drain electrodes 175, and the semiconductor stripes 151, may be completed with the same plane shapes, such that afterimage and waterfall phenomena may be more effectively minimized, and the aperture ratio of the pixels may be more effectively maximized.

On the other hand, a Cu layer made of Cu or a Cu alloy and a Mo layer made of Mo or a Mo alloy may be etched together by using a Cu etchant including hydrogen peroxide. The upper layer 170q and the lower layer 170p are etched together when the third portions of the conductive layer 170 are firstly etched by using the photoresist film 52, 54 as an etch mask, and the remaining steps can be the same as the manufacturing method of this embodiment.

Referring to FIGS. 36 to 38, a passivation layer 180 is deposited and a positive photoresist film is coated and developed to form photoresist films 62 and 64. Next, the passivation layer 180 and the gate insulating layer 140 are etched using the photoresist films 62 and 64 as an etch, mask to form a plurality of contact holes 181 exposing the end portions 129 of the gate lines 121 and a plurality of contact holes 182 exposing the end portions 179 of the data lines 171, and a plurality of contact holes 185 exposing the drain electrodes 175, respectively.

Figure 39:
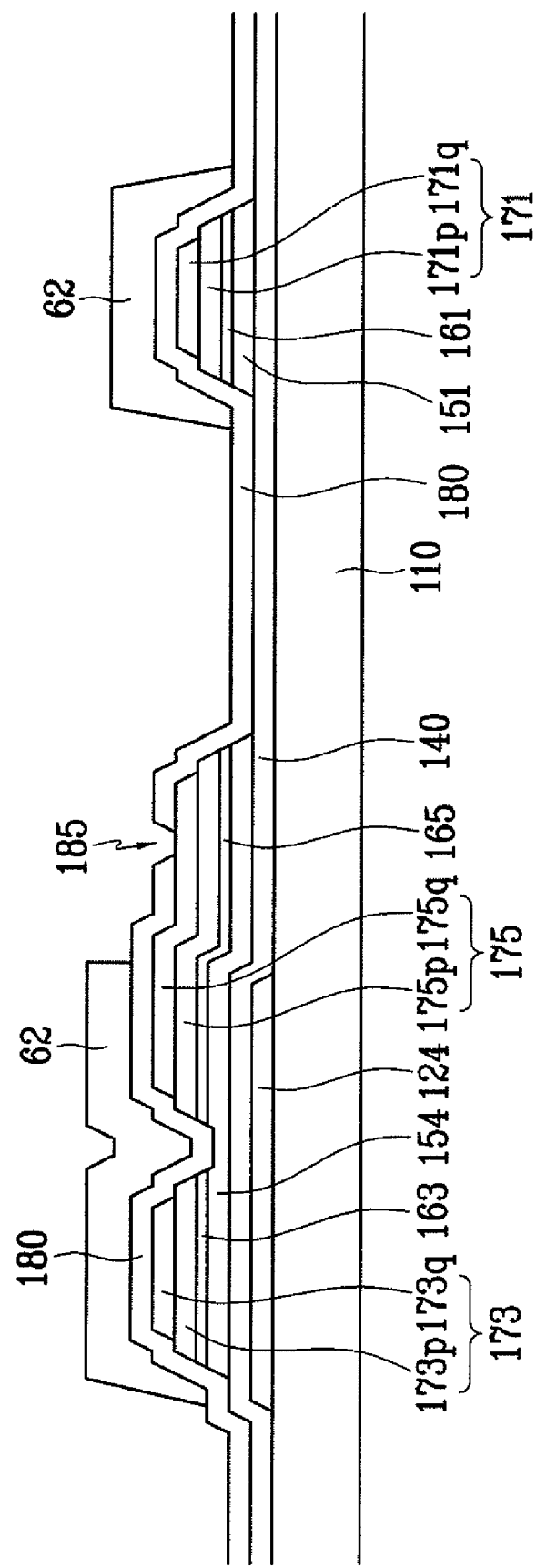
FIGS. 39 to 42 are sectional views of the TFT array panel at a step(s) following the step(s) shown in FIGS. 37 and 38.
Figure 40:
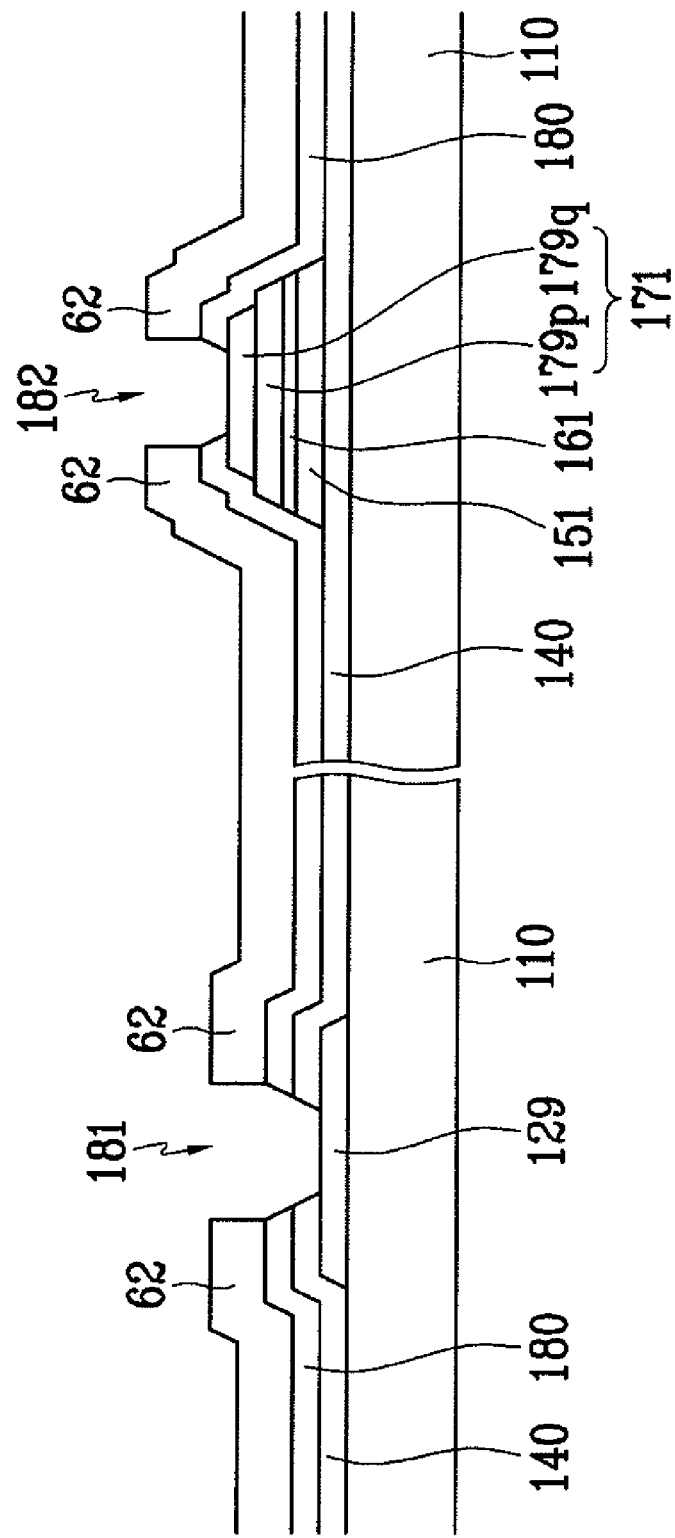

Referring to FIGS. 39 and 40, the thinner portions 64 of the photoresist films are removed by ashing, etc., and the thickness of the thicker portions 62 is decreased.

Figure 41:
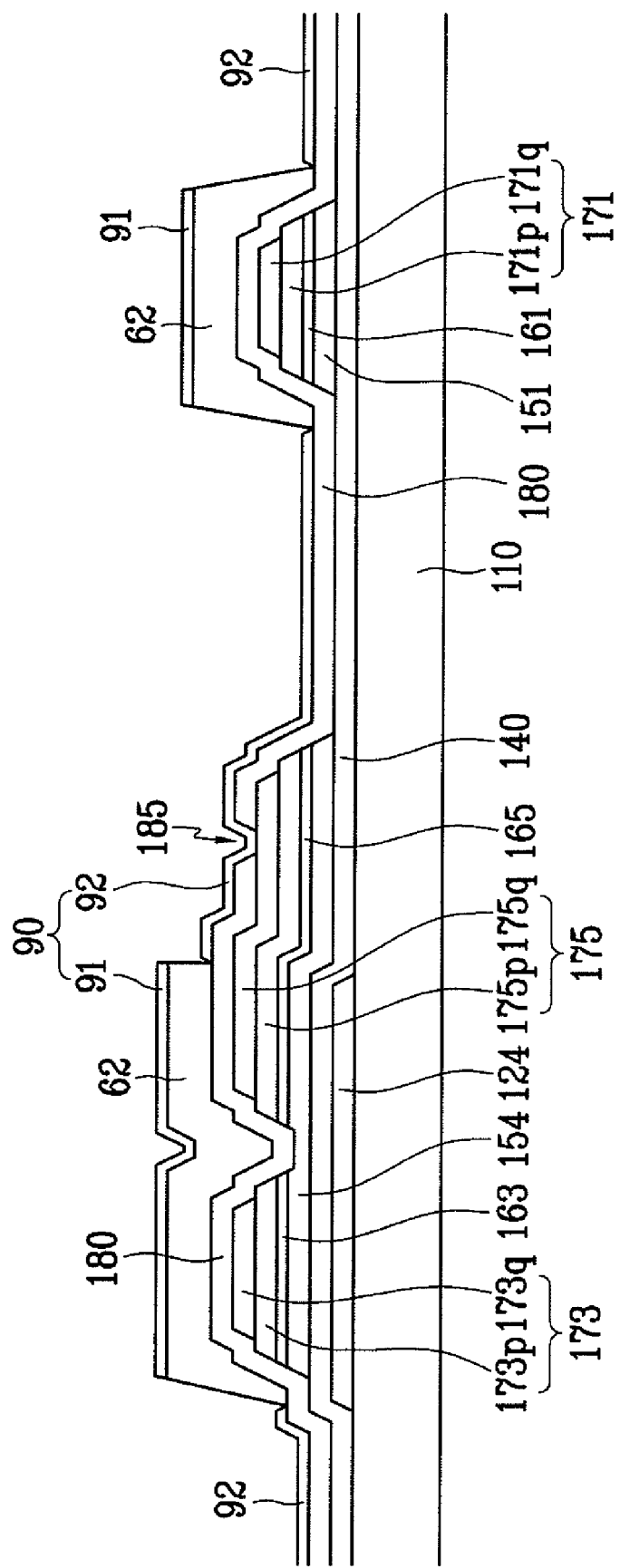
Figure 42:
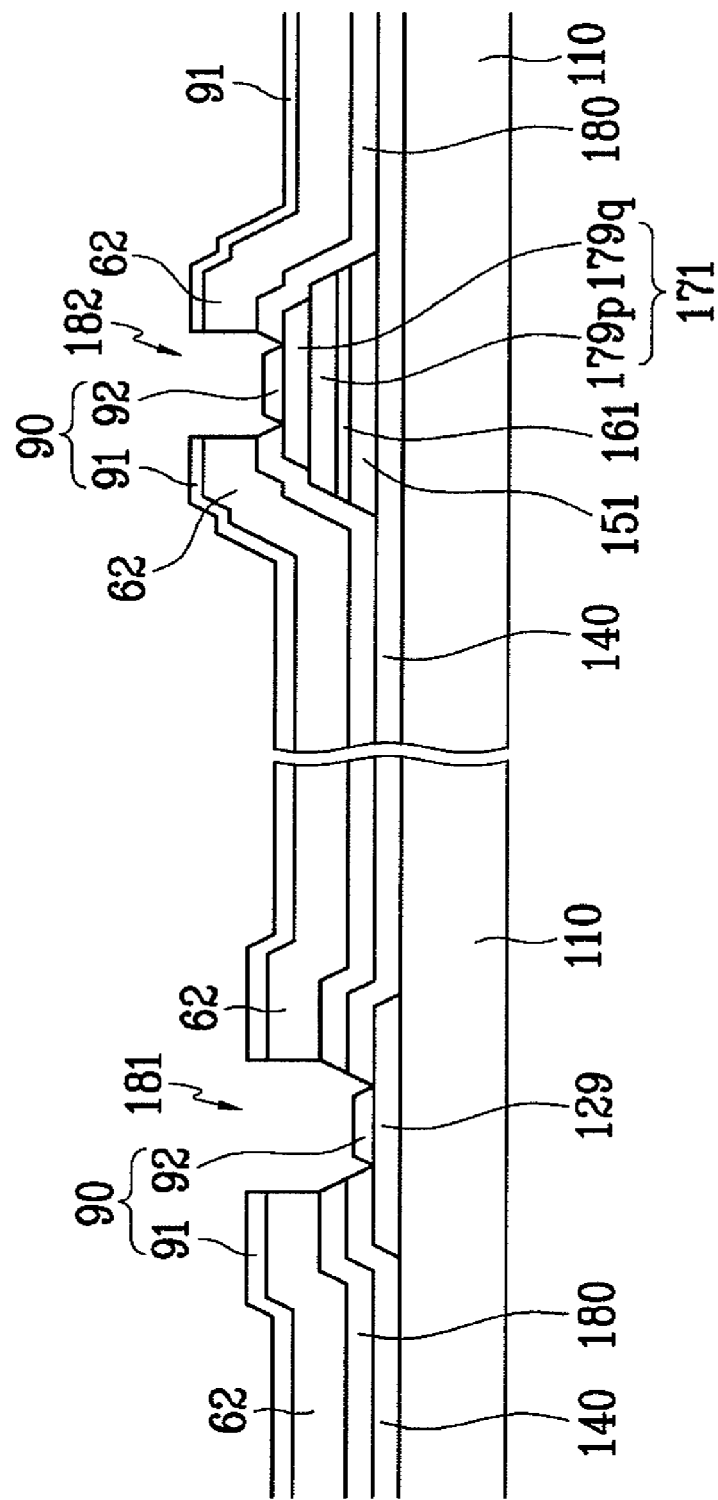
Figure 43:
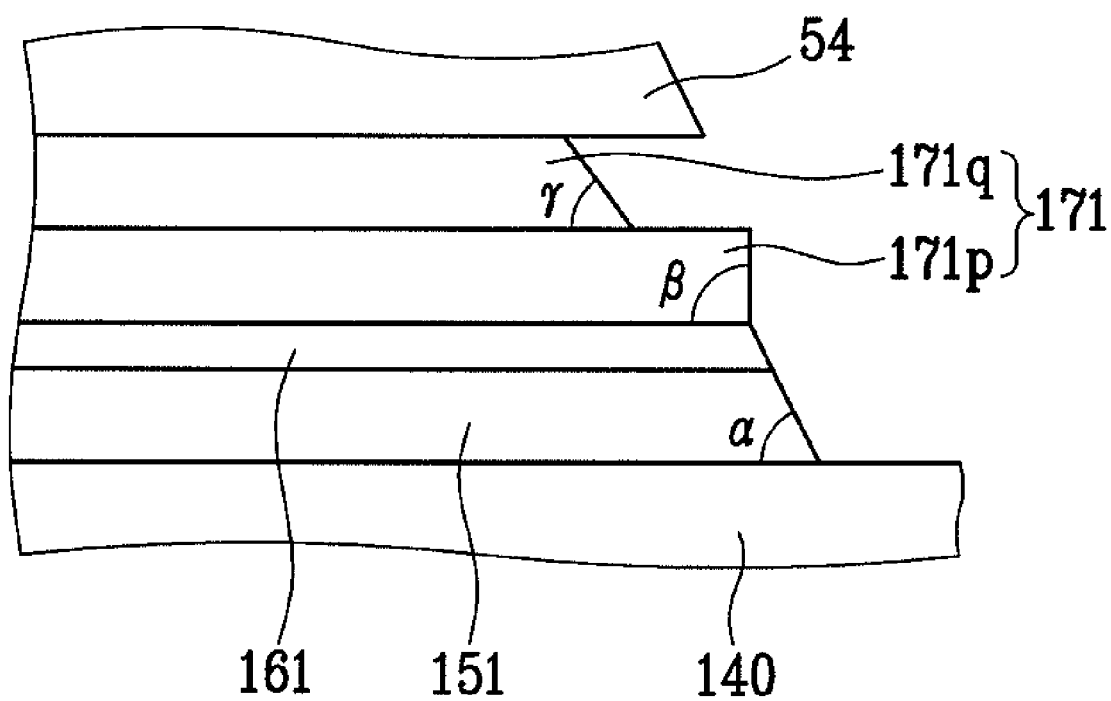
FIG. 43 is a sectional view showing a portion A of the signal line in the TFT array panel of FIG. 34.

Referring to FIGS. 41 and 42, a conductive film 90 preferably made of IZO, ITO, or amorphous ITO is deposited by sputtering, etc.

The conductive film 90 includes first portions 91 disposed on the photoresist 62 and remaining second portions 92. Since the height difference between the surface and the bottom of the photoresist 62 is large due to the thickness of the photoresist 62, the first portions 91 and the second portions 92 of the conductive film 90 are separated from each other at least in part to form gaps therebetween, and lateral sides of the photoresist 62 are exposed at least in part.

The substrate 110 is then dipped into a developer such that the developer penetrates into the photoresist 62 through the exposed lateral sides of the photoresist 62 to remove the photoresist 62. At this time, the first portions 91 of the conductive film 90 disposed on the photoresist 62 come off along with the photoresist 62, which is referred to as "lift-off." As a result, only the second portions 92 of the conductive film 90 are left to form a plurality of pixel, electrodes 191 and a plurality of contact assistants 81 and 82 as shown in FIGS. 23 to 25.

According to the manufacturing method of the TFT array panel according to embodiments of the present invention, since the data lines 171, the drain electrodes 175, the semiconductors 151, and the ohmic contacts 161 and 165 are simultaneously formed using a lithography step and a lithography step for forming the pixel electrodes 191 and the contact assistants 81 and 82 is omitted, the manufacturing process is simplified.

As described above, the pixel electrodes and the passivation, layer, or the data lines, the ohmic contacts, and the semiconductors are formed using one lithography step. Accordingly, the manufacturing process may be simplified, thereby reducing manufacturing time and cost. Also, the selective etchant is used to pattern the data lines and the semiconductors such that the semiconductor area exposed by the data lines and the drain electrodes may be minimized. Accordingly, the waterfall and afterimage phenomena may be minimized and the aperture ratio of the pixels may be maximized.

While the present invention has been described in detail with reference to exemplary embodiments, those skilled in the art will appreciate that various modifications and substitutions can be made thereto without departing from the spirit and scope of the present invention as set forth in the appended claims.

What is claimed is:

1. A method for manufacturing a signal line, comprising:
   forming a lower layer including at least one metal layer;
   depositing an upper layer including at least Cu metal on the lower layer;
   forming a photoresist film on the upper layer;
   selectively wet-etching the upper layer by using the photoresist film as an etch mask; and
   dry-etching the lower layer by using the photoresist film as an etch mask,
   wherein an etchant for the wet-etching includes ethylene glycol, sulfuric acid (H2SO4), nitric acid, and deionized water.

2. The method of claim 1, wherein the etchant for the wet-etching includes ethylene glycol at about 0.1 wt %-about 30 wt %, sulfuric acid (H2SO4) at about 0.1 wt %-about 30 wt %, nitric acid at about 1.0 wt %-about 70 wt %, and deionized water.

3. The method of claim 1, wherein the lower layer includes a conductive layer including at least one of Cr, Al, and Mo.

4. A method for forming a thin film transistor array panel, comprising;
   forming a gate line on a substrate;
   sequentially forming a gate insulating layer, a silicon layer, and a conductor layer including a lower layer and an upper layer on the gate line;
   forming a photoresist film on the conductor layer;
   patterning the photoresist film to form a photoresist pattern including a first portion and a second portion having a thinner thickness than the first portion;
   etching the upper layer and the lower layer by using the photoresist pattern as an etch mask;
   etching the silicon layer by using the photoresist pattern as an etch mask to form a semiconductor;
   removing the second portion of the photoresist pattern by using an etch back process;
   selectively wet-etching the upper layer of the conductor layer by using the photoresist pattern as an etch mask;
   dry-etching the lower layer of the conductor layer by using the photoresist pattern as an etch mask to form a data line and a drain electrode including remaining upper and lower layers; and
   forming a pixel electrode connected to the drain electrode,
   wherein an etchant for selectively wet-etching the upper layer includes ethylene glycol, sulfuric acid (H2SO4), nitric acid, and deionized water.

5. The method of claim 4, wherein the first portion of the photoresist pattern is aligned with a region corresponding to the data line and the drain electrode.

6. The method of claim 4, wherein the second portion of the photoresist pattern is aligned with a channel region between a source electrode of the data line and the drain electrode.

7. The method of claim 4, wherein the upper layer includes Cu and the lower layer includes one of Mo, Cr, and Al.

8. The method of claim 4, wherein the upper layer and the lower layer are etched under different etching conditions.

9. The method of claim 4, wherein the upper layer and the lower layer are etched under the same etching conditions.

10. The method of claim 9, wherein an etchant for etching the upper layer and the lower layer together includes hydrogen peroxide.

11. The method of claim 4, wherein the etch back process is executed before the completion of the semiconductor.

12. The method of claim 11, wherein the upper layer and the lower layer are etched under different etching conditions.

13. The method of claim 12, wherein the etch back process is executed before dry-etching of the lower layer.

14. The method of claim 11, wherein the upper layer and the lower layer are etched under the same etching conditions.

15. The method of claim 14, wherein an etchant for etching the upper layer and the lower layer together includes hydrogen peroxide.

16. The method of claim 4, wherein the gate line includes a single layer of a conductive layer made of Cu, or multi-layers including the single layer.

* * * * *